(12) United States Patent
Urakami et al.

(10) Patent No.: US 10,923,395 B2
(45) Date of Patent: Feb. 16, 2021

(54) SEMICONDUCTOR DEVICE AND MANUFACTURING METHOD OF SEMICONDUCTOR DEVICE

(71) Applicant: DENSO CORPORATION, Kariya (JP)

(72) Inventors: Yasushi Urakami, Kariya (JP); Takehiro Kato, Toyota (JP); Sachiko Aoi, Nagakute (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 16/511,345

(22) Filed: Jul. 15, 2019

(65) Prior Publication Data

US 2019/0341308 A1 Nov. 7, 2019

Related U.S. Application Data

(63) Continuation of application No. PCT/JP2018/001260, filed on Jan. 17, 2018.

(30) Foreign Application Priority Data

Jan. 17, 2017 (JP) .................. 2017-006002

(51) Int. Cl.
| | |
|---|---|
| H01L 29/423 | (2006.01) |
| H01L 21/768 | (2006.01) |
| H01L 21/02 | (2006.01) |
| H01L 21/28 | (2006.01) |
| H01L 29/06 | (2006.01) |
| H01L 29/16 | (2006.01) |
| H01L 29/417 | (2006.01) |
| H01L 29/78 | (2006.01) |

(52) U.S. Cl.
CPC .. *H01L 21/76897* (2013.01); *H01L 21/02104* (2013.01); *H01L 21/28* (2013.01); *H01L 29/0619* (2013.01); *H01L 29/0696* (2013.01); *H01L 29/1608* (2013.01); *H01L 29/417* (2013.01); *H01L 29/4236* (2013.01); *H01L 29/78* (2013.01)

(58) Field of Classification Search
CPC .................................................. H01L 29/4236
See application file for complete search history.

(56) References Cited

U.S. PATENT DOCUMENTS

| | | |
|---|---|---|
| 2007/0045631 A1 | 3/2007 | Endo et al. |
| 2008/0283845 A1 | 11/2008 | Endo et al. |
| 2009/0200559 A1 | 8/2009 | Suzuki et al. |
| 2011/0130011 A1 | 6/2011 | Sasajima et al. |

(Continued)

FOREIGN PATENT DOCUMENTS

| | | |
|---|---|---|
| JP | H04-056222 A | 2/1992 |
| JP | 2013-041919 A | 2/2013 |

(Continued)

*Primary Examiner* — Michael Carter
(74) *Attorney, Agent, or Firm* — Posz Law Group, PLC

(57) ABSTRACT

In a semiconductor device, a semiconductor element is formed in a semiconductor, an interlayer insulating film having a contact hole and containing at least one of phosphorus and boron is disposed above the semiconductor, a metal electrode is disposed above the interlayer insulating film and is connected to the semiconductor element through the contact hole, and the interlayer insulating film is filled with hydrogen.

12 Claims, 19 Drawing Sheets

(56) References Cited

U.S. PATENT DOCUMENTS

| | | | |
|---|---|---|---|
| 2012/0235137 A1* | 9/2012 | Koezuka | H01L 27/1052 257/43 |
| 2013/0019804 A1 | 1/2013 | Sasajima et al. | |
| 2015/0214028 A1 | 7/2015 | Sasajima et al. | |
| 2015/0214042 A1 | 7/2015 | Sasajima et al. | |
| 2017/0047322 A1 | 2/2017 | Yoshida et al. | |
| 2017/0141216 A1 | 5/2017 | Abe et al. | |
| 2018/0151366 A1 | 5/2018 | Endo et al. | |

FOREIGN PATENT DOCUMENTS

| | | | | |
|---|---|---|---|---|
| JP | 2013-232558 A | | 11/2013 | |
| JP | 2014-027076 A | | 2/2014 | |
| JP | 2016225455 | * | 12/2016 | |
| WO | WO-2016125490 A1 | * | 8/2016 | H01L 29/0804 |

* cited by examiner

FIG. 7

|  |  | 930°C | 870°C | 800°C |
|---|---|---|---|---|
| HYDROGEN ANNEALING BEFORE FORMING CONTACT HOLE | PATTERN 1 | OK | NG | NG |
|  | PATTERN 2 | OK | NG | NG |
|  | PATTERN 3 | OK | OK | NG |

FIG. 12

|  |  | 930°C | 870°C | 800°C |
|---|---|---|---|---|
| HYDROGEN ANNEALING BEFORE FORMING CONTACT HOLE | PATTERN 1 | OK | NG | NG |
| | PATTERN 2 | OK | OK | NG |
| | PATTERN 3 | OK | OK | NG |

US 10,923,395 B2

SEMICONDUCTOR DEVICE AND MANUFACTURING METHOD OF SEMICONDUCTOR DEVICE

CROSS REFERENCE TO RELATED APPLICATIONS

The present application is a continuation application of International Patent Application No. PCT/JP2018/001260 filed on Jan. 17, 2018, which designated the U.S. and claims the benefit of priority from Japanese Patent Application No. 2017-6002 filed on Jan. 17, 2017. The entire disclosures of all of the above applications are incorporated herein by reference.

TECHNICAL FIELD

The present disclosure relates to a semiconductor device and a manufacturing method of a semiconductor device.

BACKGROUND

Conventionally, there has been a semiconductor device that includes a cell portion in which a semiconductor element such as a MOSFET and a Schottky diode is formed, and a guard ring portion surrounding the cell portion. In such a semiconductor device, an interlayer insulating film is formed above a semiconductor in which the semiconductor element is formed, and a metal electrode is disposed through a contact hole provided in the interlayer insulating film so that the semiconductor element and the metal electrode are electrically connected.

SUMMARY

The present disclosure provides a semiconductor device and a manufacturing method of a semiconductor device in which a semiconductor element is formed in a semiconductor, an interlayer insulating film having a contact hole and containing at least one of phosphorus and boron is disposed above the semiconductor, a metal electrode is disposed above the interlayer insulating film and is connected to the semiconductor element through the contact hole, and the interlayer insulating film is filled with hydrogen.

BRIEF DESCRIPTION OF DRAWINGS

The above and other objects, features and advantages of the present disclosure will become more apparent from the following detailed description made with reference to the accompanying drawings. In the drawings:

FIG. 7 is a table showing evaluation results of the contact holes in the patterns 1 to 3;

FIG. 12 is a table showing evaluation results of the contact holes in the patterns 1 to 3.

DETAILED DESCRIPTION

Figure 1:
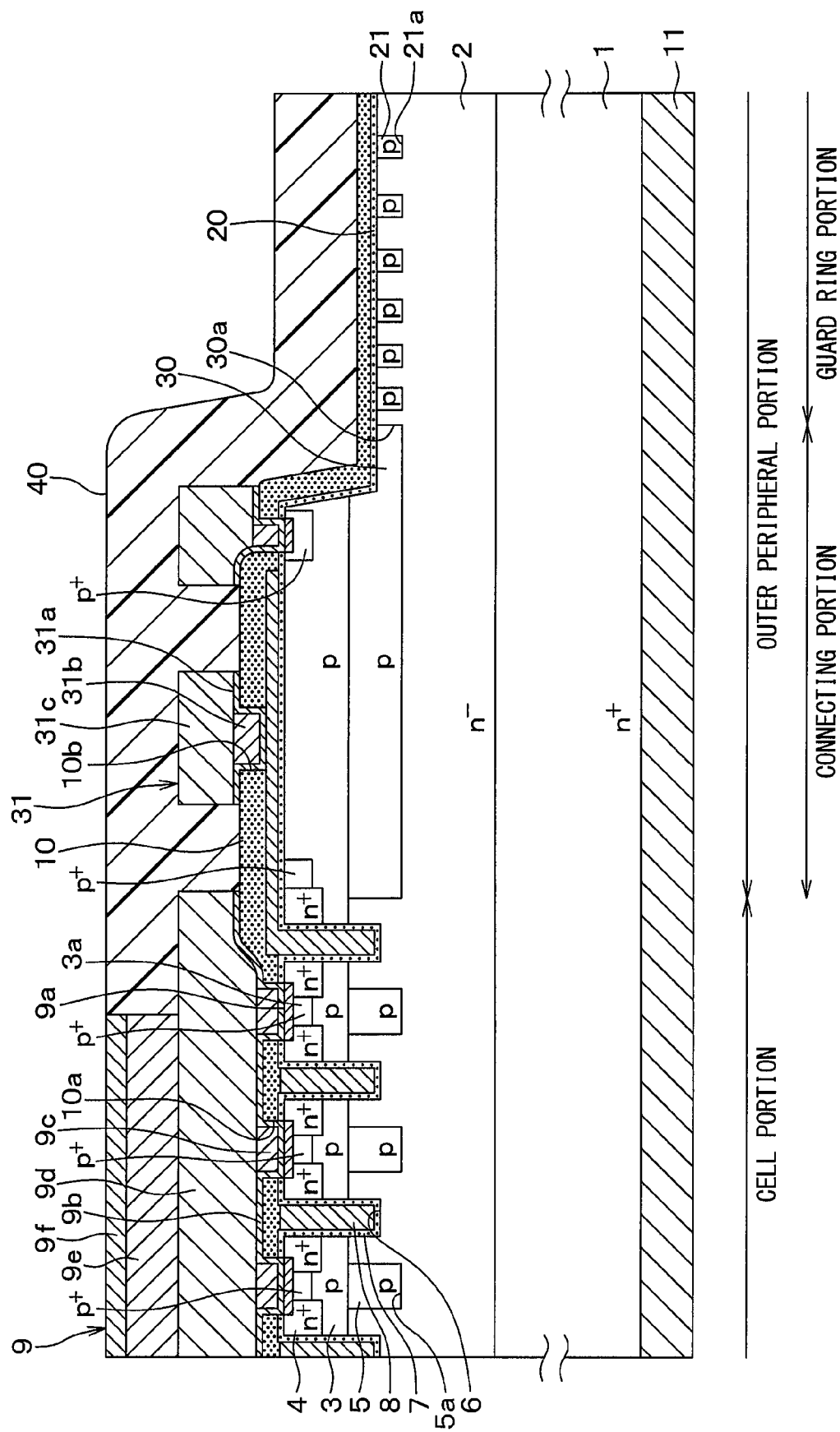
FIG. 1 is a diagram showing a cross-sectional configuration of an SiC semiconductor device according to a first embodiment.

As an interlayer insulating film in a semiconductor device, various materials can be selected, and for example, BPSG (Boro-phospho silicate glass) which becomes a flowable insulating film may be used. Since BPSG is a flowable material that flows easily by reflow, BPSG is suitable when the film thickness of the insulating film is set to be uniform after the insulating film has been formed on a surface of the semiconductor. For example, there is a case in which a surface of the semiconductor having a step is covered with an interlayer insulating film as in a mesa structure in which a cell region is protruded by providing a recess portion in an outer peripheral region. In such a structure, since a film thickness on a side surface of the step becomes thin when the interlayer insulating film is formed, an insulating film having flowability such as BPSG is used as the interlayer insulating film, and the film thickness on the side surface of the step portion is secured by flowing by reflow.

However, when the present inventors have conducted a short circuit tolerance test of a manufactured semiconductor device, cracks may occur in an insulating film provided in a semiconductor element, for example, a gate insulating film in a MOSFET, and a desired short circuit tolerance cannot be obtained in some cases. This is presumed to be due to the following mechanism.

For example, an interlayer insulating film made of BPSG is formed on a semiconductor in which the MOSFET is formed as a semiconductor element, and after a contact hole has been provided, a metal electrode made of an Al—Si film is formed, and the short circuit tolerance test is performed. In the short circuit tolerance test, the short circuit tolerance when the semiconductor element is turned on due to an erroneous signal to a gate electrode is measured when 1000 V is applied between a source and a drain.

When such a short circuit tolerance test is performed, a large current flows to generate a heat in the semiconductor element. For example, in the case of the MOSFET, the heat is generated in a semiconductor portion of the MOSFET. When the heat is transmitted to the metal electrode, the metal electrode is melted because a melting point of a material of the metal electrode mainly made of Al is low. The molten metal electrode solidifies when the semiconductor device is turned off, and when the metal electrode solidifies, a stress is applied to the interlayer insulating film, which is further transmitted to the gate insulating film, and a crack is generated in the gate insulating film. Alternatively, since the metal electrode expands and contracts when the semiconductor element generates the heat and is cooled by on and off operation, and the stress is applied to the interlayer insulating film, the stress is also transmitted to the gate insulating film, and the crack is generated in the gate insulating film. It is presumed that a high short circuit tolerance cannot be obtained since such a mechanism causes the crack to be generated in the gate insulating film and a short circuit occurs, for example, between the gate and the source.

When the interlayer insulating film is made of a flowable material such as BPSG, since a corner of a side wall of the contact hole is rounded and a size of an entrance of the opening portion is wider than a size of a bottom portion, the stress generated as described above is increased and the short circuit tolerance is further lowered.

Therefore, even when an interlayer insulating film is made of a flowable material such as BPSG, it is desired to obtain the short circuit tolerance of the semiconductor element. In particular, in a silicon carbide (SiC) semiconductor device, since a large current is used, a heat generation in a semiconductor element tends to be large, and an issue of lowering the short circuit tolerance tends to occur.

Although the issue of lowering the short circuit tolerance has been described as an example, it has been confirmed that various issues occur due to the stress generated by rounding the corner of the side wall of the contact hole of the interlayer insulating film. For example, even in a cold-heat cycle test in which a sample is repeatedly exposed to a low temperature and a high temperature, or a power cycle test in which a temperature is repeatedly changed by repeatedly turning on and off the semiconductor element, it has been confirmed that durability of the semiconductor device is lowered due to the above-mentioned stress.

A semiconductor device according to a first aspect of the present disclosure includes a semiconductor in which a semiconductor element is formed, an interlayer insulating film disposed above the semiconductor, having a contact hole connected to the semiconductor element, and containing at least one of phosphorus and boron, and a metal electrode disposed above the interlayer insulating film and connected to the semiconductor element through the contact hole, and the interlayer insulating film is filled with hydrogen.

As described above, the interlayer insulating film is densified by filling the interlayer insulating film with hydrogen. The interlayer insulating film subjected to such densification is harder compared with a case where the densification is not performed. Thus, even if a heating process of high temperature is performed after the contact hole has been formed in the interlayer insulating film, a corner of a side wall of the contact hole is restricted from being rounded, and the side wall can be formed into a precipitous contact hole. As a result, even if the amount of penetration of the metal electrode into the contact hole is large, deformation of the interlayer insulating film due to stress is reduced. Therefore, a durability of the semiconductor device can be improved.

A manufacturing method of a semiconductor device according to a second aspect of the present disclosure includes forming an interlayer insulating film above a semiconductor in which a step is defined by providing a recess portion, performing reflow to cause the interlayer insulating to flow and to cover the step with the interlayer insulating film having a predetermined film thickness, performing hydrogen annealing at 870° C. or more to fill the interlayer insulating film with hydrogen and to densify the interlayer insulating film after covering the step with the interlayer insulating film having the predetermined film thickness, and providing the contact hole after the densifying.

By performing the hydrogen annealing as described above, the interlayer insulating film can be filled with hydrogen and the densification process of the interlayer insulating film can be performed. As a result, even if the heating process of high temperature is performed after the contact hole has been provided in the interlayer insulating film, the corner of the side wall of the contact hole can be restricted from being rounded, and the contact hole can be formed with the precipitous side wall. Therefore, a semiconductor device capable of improving durability can be manufactured.

A manufacturing method of a semiconductor device according to a third aspect of the present disclosure includes forming an interlayer insulating film above a semiconductor in which a step is defined by providing a recess portion, performing reflow to cause the interlayer insulating film to flow and to cover the step with the interlayer insulating film having a predetermined film thickness, providing the contact hole after covering the step with the interlayer insulating film having the predetermined film thickness, and performing hydrogen annealing at 870° C. or more to fill the interlayer insulating film with hydrogen and to densify the interlayer insulating film after providing the contact hole.

As described above, even if the hydrogen annealing is performed after the contact hole has been provided, a semiconductor device capable of improving the durability can be manufactured similarly to the method for manufacturing the semiconductor device in the second aspect described above.

Embodiments of the present disclosure will be described below with reference to the drawings. In the following embodiments, the same reference numerals are assigned to parts that are the same or equivalent to each other.

First Embodiment

A first embodiment will be described. In this example, as a semiconductor device, an SiC semiconductor device in which an inverted MOSFET having a trench gate structure is formed as a semiconductor element will be exemplified.

As shown in FIG. 1, the SiC semiconductor device is configured to include a cell portion in which a MOSFET of a trench gate structure is formed and an outer peripheral portion surrounding the cell portion. The outer peripheral portion is configured to have a guard ring portion and a connecting portion disposed inside the guard ring portion, that is, between the cell portion and the guard ring portion.

The SiC semiconductor device is formed with the use of a semiconductor substrate in which an $n^-$-type drift layer 2 made of SiC having an impurity concentration lower than an impurity concentration of an n$^+$-type substrate 1 is epitaxially grown on a front surface of an n$^+$-type substrate 1 configuring a high-concentration impurity layer made of SiC. In other words, a rear surface side of the semiconductor substrate is a high concentration impurity layer of the n$^+$-type substrate 1, and a front surface side of the semiconductor substrate is an n$^-$-type drift layer 2 having an impurity concentration lower than the impurity concentration of the high-concentration impurity layer. Then, a p-type base region 3 is epitaxially grown on the n$^-$-type drift layer 2, and an n$^+$-type source region 4 is formed in a surface layer portion of the p-type base region 3.

The n$^+$-type substrate 1 has, for example, an n-type impurity concentration of $1.0\times10^{19}$ cm$^{-3}$, and a surface of the n$^+$-type substrate 1 is a (0001) Si surface. The n$^-$-type drift layer 2 has an impurity concentration lower than the impurity concentration of the n$^+$-type substrate 1, for example, an n-type impurity concentration of $0.5\times10^{16}$ cm$^{-3}$ to $2.0\times10^{16}$ cm$^{-3}$.

In addition, in the p-type base region 3, the p-type impurity concentration is set to be approximately $2.0\times10^{17}$ cm$^{-3}$ and the thickness is set to 300 nm in a portion where a channel region is formed. The n$^+$-type source region 4 has an impurity concentration higher than the impurity concentration of the n$^-$-type drift layer 2, and the n-type impurity concentration in the surface layer portion is, for example, $2.5\times10^{18}$ cm$^{-3}$ to $1.0\times10^{19}$ cm$^{-3}$ and the thickness is about 0.5 µm.

In the cell portion and the connecting portion, the p-type base region 3 is left on a front surface side of the n$^+$-type substrate 1, and in the guard ring portion, a recess portion 20 is provided so as to penetrate through the p-type base region 3 and reach the n$^-$-type drift layer 2. Such a structure configures a mesa structure.

In the cell portion and the connecting portion, a contact region 3a formed of p-type high concentration layers is formed on a surface of the p-type base region 3.

Further, in the cell portion, p-type deep layers 5 are formed below the p-type base region 3, that is, in the surface layer portion of the n$^-$-type drift layer 2. The p-type deep layers 5 have a p-type impurity concentration higher than the impurity concentration of the p-type base region 3. The p-type deep layers 5 extend in a direction perpendicular to a paper plane of FIG. 1, that is, in the same direction as a trench gate structure to be described later as a longitudinal direction. Specifically, the multiple p-type deep layers 5 are provided in multiple striped trenches 5a disposed at regular intervals in the n$^-$-type drift layer 2 and spaced apart from each other without intersection. For example, each p-type deep layer 5 has a p-type impurity concentration about $1.0\times10^{17}$ cm$^{-3}$ to $1.0\times10^{19}$ cm$^{-3}$, a width about 0.7 µm, and a depth about 2.0 µm.

Gate trenches 6 having, for example, a width of 0.8 µm and a depth of 1.0 µm are provided so as to penetrate through the p-type base region 3 and the n$^+$-type source region 4 and reach the n$^-$-type drift layer 2. The p-type base region 3 and the n$^+$-type source region 4 are disposed so as to be in contact with side surfaces of the gate trenches 6. The gate trenches 6 are formed in a linear layout in which a horizontal direction of the paper plane shown in FIG. 1 is a width direction, a direction perpendicular to the paper plane is a longitudinal direction, and a vertical direction of the paper plane is a depth direction, and the multiple gate trenches are disposed in parallel and at regular intervals so as to be striped.

Further, a channel region connecting the n$^+$-type source region 4 and the n$^-$-type drift layer 2 when the vertical MOSFET is operated is provided in a portion of the p-type base region 3 located on a side surface of the gate trench 6, and a gate insulating film 7 is formed on an inner wall surface of the gate trench 6 including the channel region. The gate insulating film 7 is formed of, for example, a thermal oxide film. A gate electrode 8 made of doped Poly-Si is formed on a surface of the gate insulating film 7, and the gate trench 6 is filled with the gate insulating film 7 and the gate electrode 8.

The gate insulating film 7 is also formed on a surface other than the inner wall surface of the gate trench 6. More specifically, the gate insulating film 7 is formed on a part of the surface of the n$^+$-type source region 4 and also on the surface of the p-type base region 3 at the connecting portion. The gate electrode 8 also extends over a surface of the gate insulating film 7 in the connecting portion.

Surfaces of the n$^+$-type source region 4 and the contact region 3a are connected to a source electrode 9 corresponding to a first electrode. Similarly, the gate electrode 8 is connected to a gate pad 31 at a portion extended to the connecting portion. The source electrodes 9 and the gate pad 31 are formed above a semiconductor in which the respective components of an MOSFET are formed through an interlayer insulating film 10 formed above the gate insulating film 7 and the like. The source electrode 9 and the gate pad 31 are connected to the respective components through contact holes 10a and 10b provided in the interlayer insulating film 10. The source electrode 9 and the gate pad 31 are made of multiple metals. The contact holes 10a and 10b can have any pattern, and include, for example, a pattern in which multiple square shapes are arrayed, a pattern in which rectangular short line shapes are arrayed, a pattern in which line shapes are arrayed, or the like.

The source electrode 9 is configured as follows. Specifically, a metal silicide 9a made of a metal such as Ni (nickel) is formed at a portion of the source electrodes 9 in contact with the n$^+$-type source region 4 and the contact region 3a. A barrier metal 9b made of Ti (titanium), TiN, or the like is formed on the metal silicide 9a, and W (tungsten) plugs 9c and an Al—Si layer 9d mainly made of Al are formed on the barrier metal 9b. An Au layer 9f is formed on a surface of the Al—Si layer 9d through an Ni plating layer 9e.

On the other hand, the gate pad 31 is configured as follows. Specifically, a barrier metal 31a made of TiN or the like is formed at a contact portion of the gate pad 31 with the gate electrode 8, and a W plug 31b and an Al—Si layer 31c mainly made of Al are formed on the barrier metal 31a. Although not shown, an Au layer may also be formed over a surface of the Al—Si layer 31c through an Ni plating layer.

The metal silicide 9a is provided to reduce contact resistances between the n$^+$-type source regions 4 and the contact regions 3a and the source electrode 9.

The barrier metals 9b and 31a serves to inhibit Al contained in the Al—Si layers 9d and 31c from diffusing into the semiconductor side and the interlayer insulating film 10 side. The barrier metal 9b also serves to restrict the Ni in the metal silicide 9a from diffusing toward the Al—Si layer 9d.

The W plugs 9c and 31b serve to reduce the penetration of the Al—Si layers 9d and 31c into the contact holes 10a and 10b provided in the interlayer insulating film 10 by planarizing the underlying surfaces of the Al—Si layers 9d and 31c. The W plugs 9c and 31b also serve to fill the contact holes 10a and 10b with a material having a higher melting point than Al. If the penetration of the Al—Si layers 9d and 31c into the contact holes 10a and 10b is reduced, when the Al—Si layers 9d and 31c are expanded and contracted or melted and solidified by heat generation, the Al—Si layers 9d and 31c are merely expanded and contracted or solidified on a flat surface. Thus, a stress applied to the interlayer insulating film 10 is reduced. In addition, since the melting point of W is higher than Al, even if the W plugs 9c and 31b are disposed in the contact holes 10a and 10b, melting of the W plugs 9c and 31b due to the heat generation of the semiconductor element is unlikely to occur, and therefore, a phenomenon that the semiconductor device is melted and then solidified can be reduced. Therefore, the stress applied to the interlayer insulating film 10 is further reduced.

The Al—Si layers 9d and 31c are generally used as electrode materials and correspond to metal electrodes. In this example, the metal electrodes are configured by the Ai-Si layers 9d and 31c, but may be made of other materials containing Al as a main component, such as Al alone. Basically, it is preferable that the source electrodes 9 and the gate pads 31 can be formed of only the Al—Si layers 9d and 31c containing Al as a main component. However, in consideration of the diffusion of Al, the source electrode 9 and the gate pad 31 may be formed of not only the Al—Si layers 9d and 31c but also other materials.

The Ni plating layer 9e and the Au layer 9f are formed in order to improve the solder wettability when a connection to the outside through the source electrode 9 is performed.

Further, a drain electrode 11 corresponding to a second electrode electrically connected to the $n^+$-type substrate 1 is formed on a rear surface of the $n^+$-type substrate 1. Such a structure configures a MOSFET of an n-channel type inverted trench gate structure. The cell portion is formed by arraying multiple cells of the MOSFETs described above.

On the other hand, in the guard ring portion, as described above, the recess portion 20 is formed so as to penetrate through the $n^+$-type source regions 4 and the p-type base regions 3 and reach the $n^-$-type drift layer 2. Thus, the $n^+$-type source regions 4 and the p-type base regions 3 are removed at positions away from the cell portion, and the $n^-$-type drift layer 2 is exposed. In the thickness direction of the $n^+$-type SiC substrate 1, the cell portion and the connecting portion located inside the recess portion 20 are mesa portions projecting in an island shape, and a step is provided between the cell portion and the connecting portion and the guard ring portion.

Also, a surface layer portion of the $n^-$-type drift layer 2 located below the recess portion 20 is provided with multiple p-type guard rings 21 to surround the cell portion. A top view layout of the p-type guard rings 21 has a square shape, a circular shape, or the like in which four corners are rounded, as seen from a normal direction with respect the surface of the semiconductor substrate (hereinafter, referred to as a substrate normal direction). The p-type guard rings 21 are disposed in trenches 21a provided in the surface layer portion of the $n^-$-type drift layer 2, for example, and are formed of a p-type epitaxial film by epitaxial growth.

Although not shown, an EQR structure is provided on an outer periphery of the p-type guard rings 21 as necessary, thereby forming a guard ring portion provided with an outer peripheral high breakdown voltage structure surrounding the cell portion.

In addition, a p-type resurf layer 30 is formed in the surface layer portion of the $n^-$-type drift layer 2 at the inner peripheral sides of the connecting portion and the guard ring portion, as the connecting portion from the cell portion to the guard ring portion. For example, when viewed from the substrate normal direction, yje connecting portion is formed so as to surround the cell portion, and the multiple rectangular p-type guard rings 21 having four rounded corners are formed so as to surround the outside of the connecting portion. The p-type resurf layer 30 extends so as to reach the guard ring portion while surrounding the cell portion. The p-type resurf layer 30 is also disposed in a trench 30a provided in the surface layer portion of the n-type drift layer 2, and is formed of a p-type epitaxial film by epitaxial growth.

With the formation of the p-type resurf layer 30 described above, equipotential lines can be guided to the guard ring portion side, and a portion where an electric field concentrates in the connecting portion can be prevented from being generated, so that a drop in breakdown voltage can be reduced.

Further, a protective film 40 made of polyimide or the like is formed so as to cover the cell portion, the connecting portion, and the guard ring portion configured as described above. As shown in FIG. 1, the source electrode 9 is exposed from the protective film 40, and the gate pad 31 is exposed from the protective film 40 in a cross section different from that of FIG. 1.

The SiC semiconductor device according to the present embodiment is configured by the structure described above. In the SiC semiconductor device configured as described above, when the MOSFET is turned on, a channel region is formed in the surface portion of the p-type base region 3 located on the side surface of the gate trench 6 by controlling the voltage applied to the gate electrode 8. As a result, a current flows between the source electrode 9 and the drain electrode 11 through the $n^+$-type source regions 4 and the $n^-$-type drift layer 2.

At the time of a reverse bias, the p-type resurf layer 30 is formed in the connecting portion, so that a rising of the equipotential lines is reduced and directed toward the guard ring portion side. In the guard ring portion, the p-type guard ring 21 terminates the equipotential lines while intervals of the equipotential lines spread in an outer circumferential direction, and a desired withstand voltage can be obtained in the guard ring portion. Therefore, an SiC semiconductor device capable of obtaining a desired breakdown voltage can be obtained.

Next, a manufacturing method of the SiC semiconductor device according to the present embodiment will be described with reference to FIGS. 2 to 3. However, in the manufacturing method, processes of forming the $n^-$-type drifting layer 2 on the $n^+$-type substrate 1, forming the p-type deep layers 5, forming the p-type base regions 3 and the $n^+$-type source regions 4, forming the contact regions 3a, and forming the trench gate structures are the same as conventional processes. Thus, each process after the processes same as the conventional processes will be described.

Figure 2:
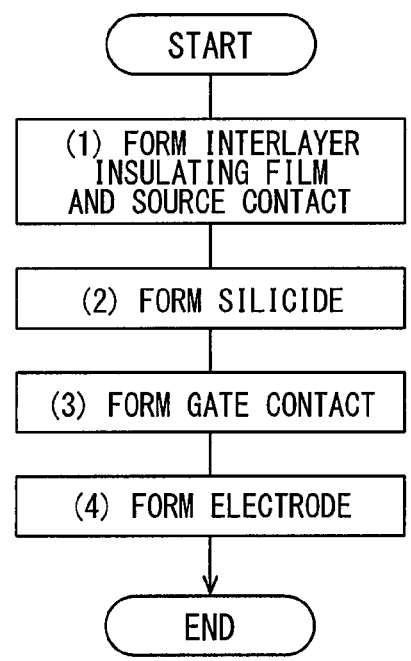
FIG. 2 is a flowchart showing a part of a manufacturing process of the SiC semiconductor device shown in FIG. 1.

As shown in the flowchart of the manufacturing process shown in FIG. 2, (1) a forming process of the interlayer insulating film 10 and the contact holes 10a of the source electrode 9, (2) a forming process of silicide, (3) a forming process of the contact hole 10b of the gate pad 31, and (4) a forming process of electrodes are performed. Hereinafter, each of those processes will be described as the processes (1) to (4).

[Process (1)]

Figure 3A:
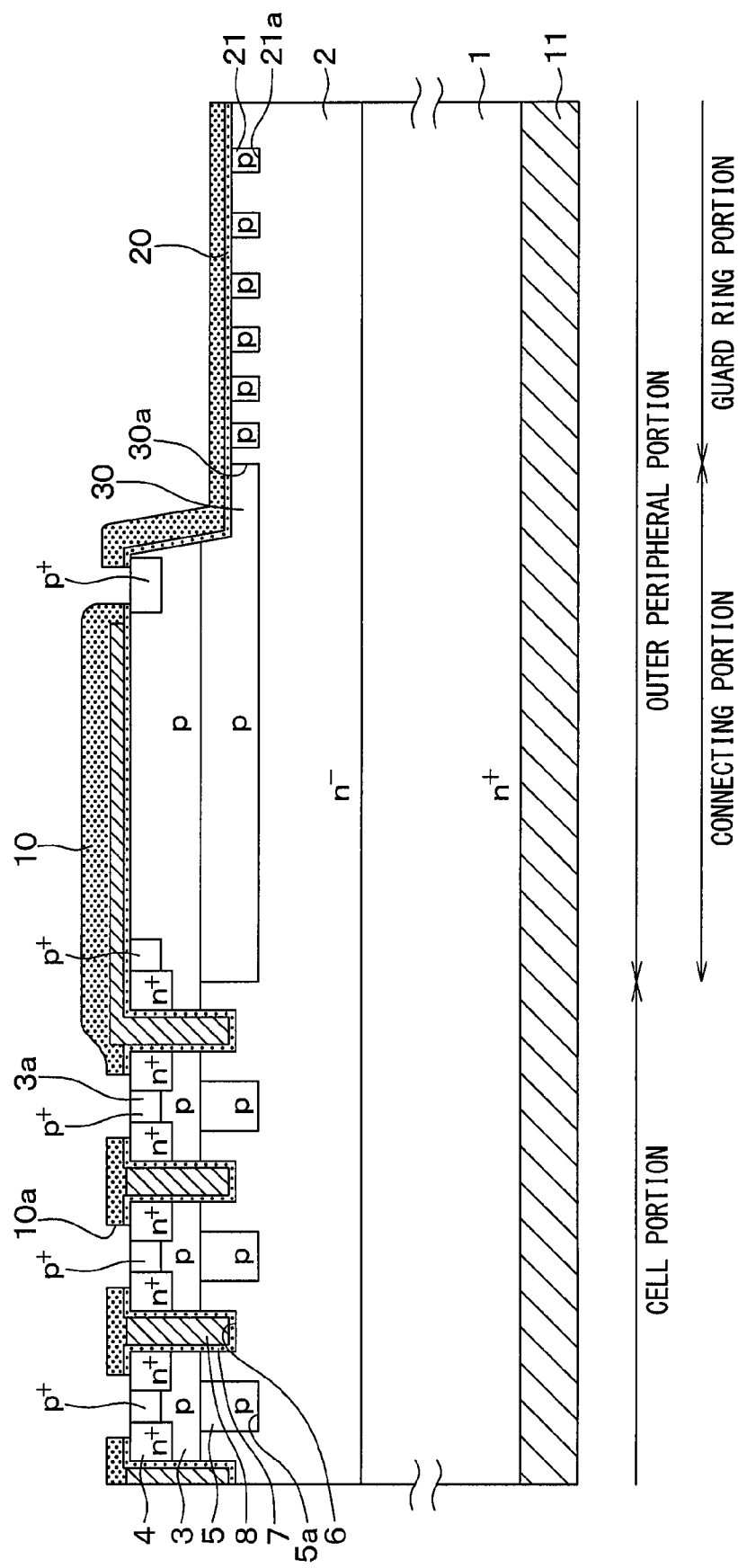
FIG. 3A is a cross-sectional view of the SiC semiconductor device shown in FIG. 1 in the manufacturing process.

FIG. 3A is a cross-sectional view when the process (1) is performed. First, the trench gate structures are formed, and the interlayer insulating film 10 is formed on the gate insulating films 7 and the gate electrodes 8 formed over the surface of the semiconductor, that is, on the surfaces of the p-type base regions 3, the $n^+$-type source regions 4, and the contact regions 3a. The interlayer insulating film 10 is made of PBSG serving as a flowable oxide film, but can also be made of PSG (phospho silicate glass) or BSG (Boron silicate glass).

Next, for example, a reflow in an $N_2$ (nitrogen) atmosphere, that is, $N_2$ annealing is performed. When the interlayer insulating film 10 is formed, the step is provided between the cell portion and the connecting portion and the guard ring portion by the recess portion 20. Thus, the interlayer insulating film 10 is allowed to flow by reflow, and the interlayer insulating film 10 is set to have a desired film thickness even in the step portion. Since the step is covered with the interlayer insulating film 10 having a desired film thickness as described above, a high breakdown voltage can be obtained also at the step portion.

Subsequently, the interlayer insulating film 10 is subjected to a densification process to reduce the flowability and to be harden. Specifically, a heat treatment is performed in a hydrogen atmosphere to perform a $H_2$ annealing. The temperature of the heat treatment is 800° C. or more, preferably 870° C. or more, for example, 930° C. or more. A time of the heat treatment is set to 20 minutes. With the execution of the $H_2$ annealing described above, the interlayer insulating film 10 can be densified. Although the above mechanism has not been clarified, it is presumed that, for example, when the interlayer insulating film 10 is made of BPSG, Si or Si—O, which has not been completely converted into a $SiO_2$ by filling with hydrogen, is combined with hydrogen, and a bonding force can be enhanced. In other words, it is considered that H is easily bonded as a dangling bond to Si or Si—O unbonded bonds and enters between molecules, whereby the bonding of the interlayer insulating film 10 in which the unbonded bonds exist and the bonding is weak is strengthened, and is densified by solidification.

After the densification process has been performed, a photoresist (not shown) is formed on the interlayer insulating film 10 (not shown), followed by exposure and development, and further UV (ultraviolet) irradiation is performed to pattern the photoresist. As a result, regions of the photoresist where the contact holes 10a are to be provided are opened, and a mask made of the photoresist is formed. Then, the interlayer insulating film 10 is etched with the use of the photoresist mask to define the contact holes 10a for the source electrode 9 in the interlayer insulating film 10.

[Process (2)]

Figure 3B:
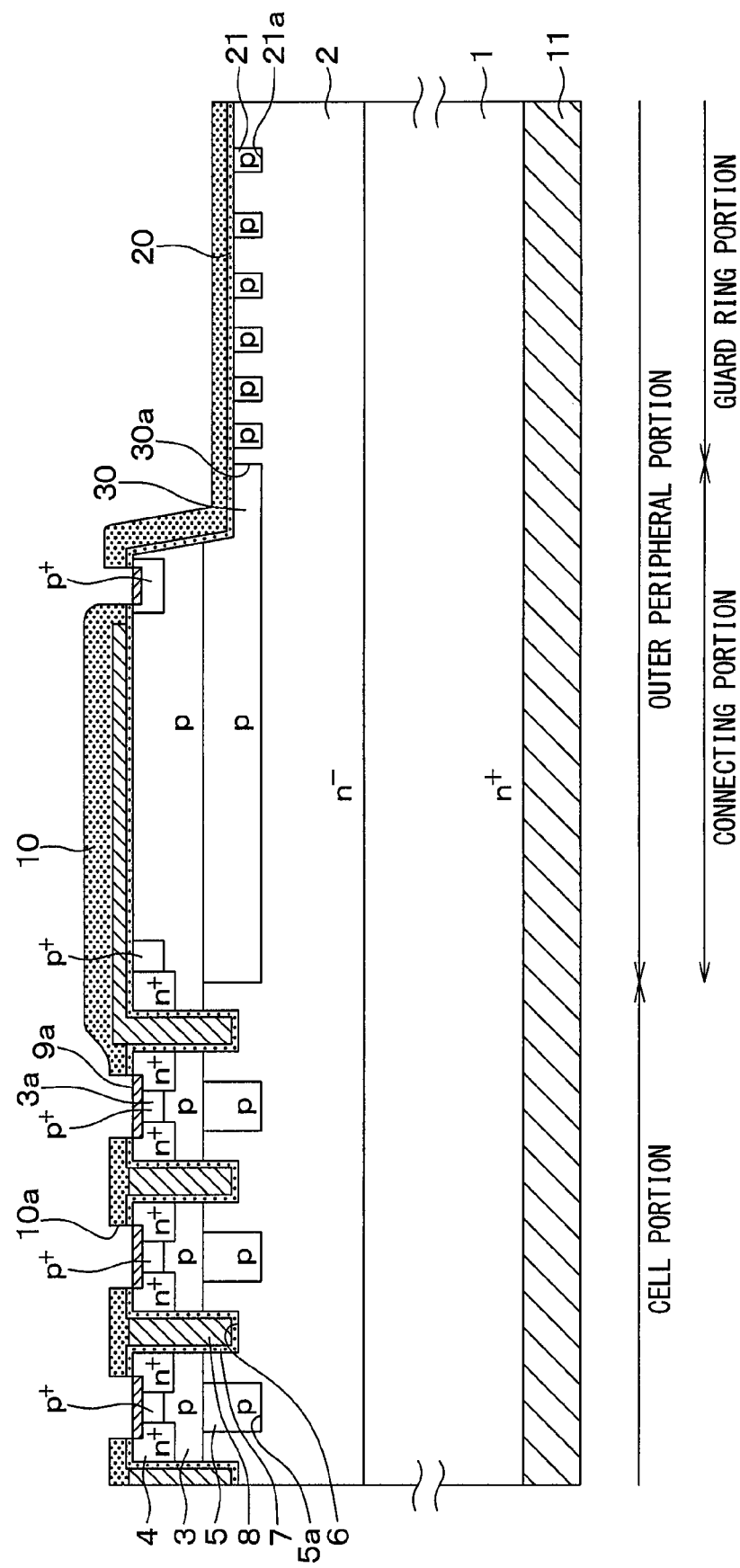
FIG. 3B is a cross-sectional view of the SiC semiconductor device in the manufacturing process subsequent to FIG. 3A.

FIG. 3B is a cross-sectional view when the process (2) is performed. In this process, the metal silicide 9a is formed on the bottom portions of the contact holes 10a provided in the process (1). First, since there is a possibility that a natural oxide film is formed on the bottom surfaces of the contact holes 10a during a period from the process (1) to the process (2), the natural oxide film is etched with the use of HF (hydrofluoric acid). Then, after a Ni film has been formed on the interlayer insulating film 10 including the inside of the contact holes 10a, a first metal sintering is performed by heating at, for example, 600 to 750° C., and Si present in SiC on the bottom surfaces of the contact holes 10a and Ni in the Ni film are subjected to a silicidation reaction. As a result, a metal silicide 9a made of Ni—Si is formed.

Thereafter, the Ni film is immersed in an etchant to remove the remainder of the Ni film which is not the metal silicide 9a, so that only the metal silicide 9a remains. Then, a second metal sintering is performed at a temperature higher than the temperature of the first metal sintering, for example, at 800 to 900° C., and the metal silicide 9a is solidified. As a result, the resistivity of the metal silicide 9a can be further lowered.

The process (2) described so far is preferably performed particularly when SiC is used as the semiconductor. However, since the process (2) includes a process of a high temperature treatment, when the interlayer insulating film 10 is made of a flowable material, the corners of the side walls of the contact holes 10a may be rounded by the flow of the interlayer insulating film 10.

On the other hand, according to the present embodiment, a densification process is performed to make the interlayer insulating film 10 less flowable and hardened before the high temperature treatment is performed. Thus, since the interlayer insulating film 10 is solid, the interlayer insulating film 10 can be restricted from being rounded even when the high temperature treatment is performed.

[Process (3)]

Figure 3C:
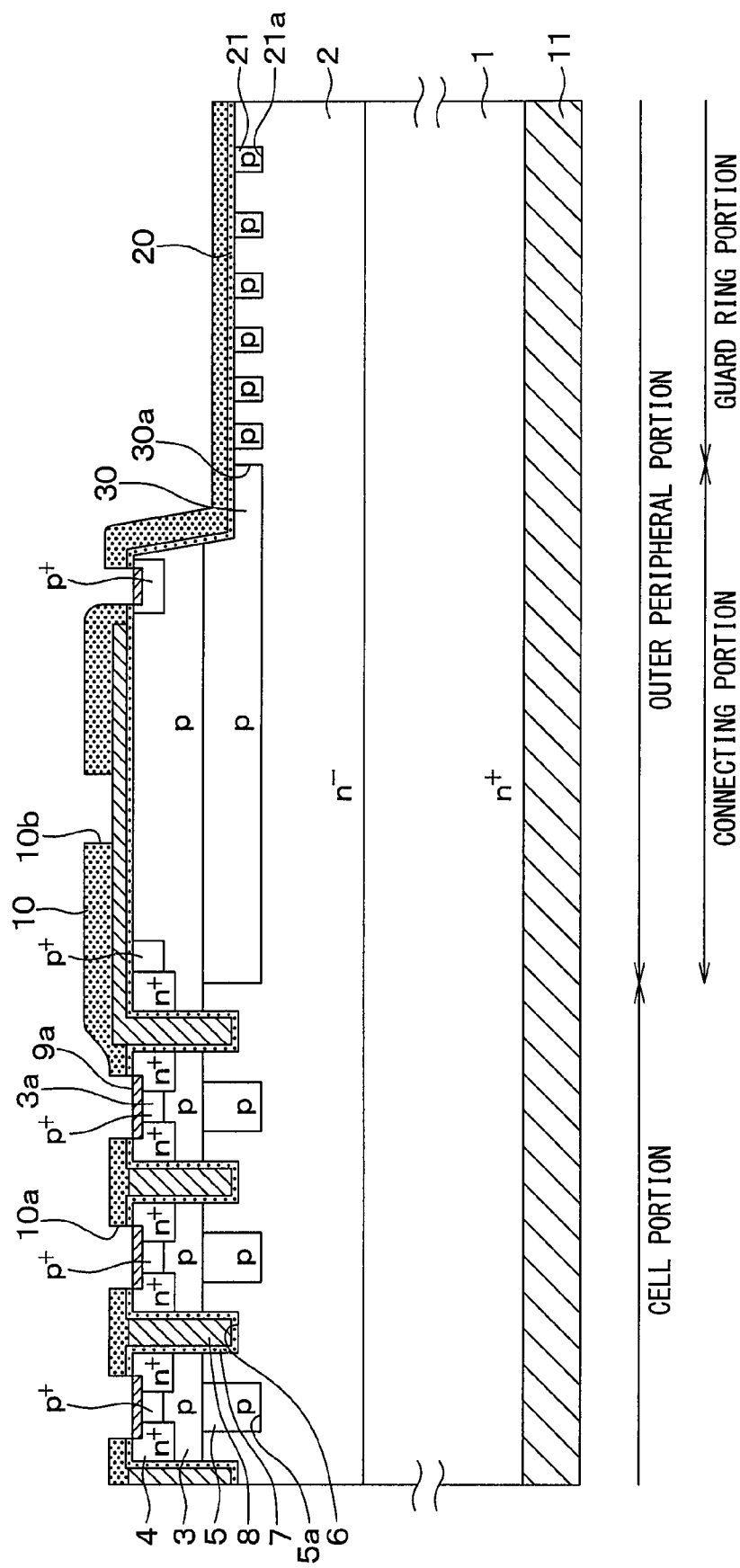
FIG. 3C is a cross-sectional view of the SiC semiconductor device in the manufacturing process subsequent to FIG. 3B.

FIG. 3C is a cross-sectional view when the process (3) is performed. Although not shown, after a photoresist (not shown) has been formed on the interlayer insulating film 10, exposure and development are performed, and further UV irradiation is performed to pattern the photoresist. As a result, a region of the photoresist where the contact hole 10b is to be formed is opened, and a mask made of the photoresist is formed. Then, the interlayer insulating film 10 is etched with the use of the photoresist mask to form the contact hole 10b for the gate pad 31 in the interlayer insulating film 10.

[Process (4)]

Figure 3D:
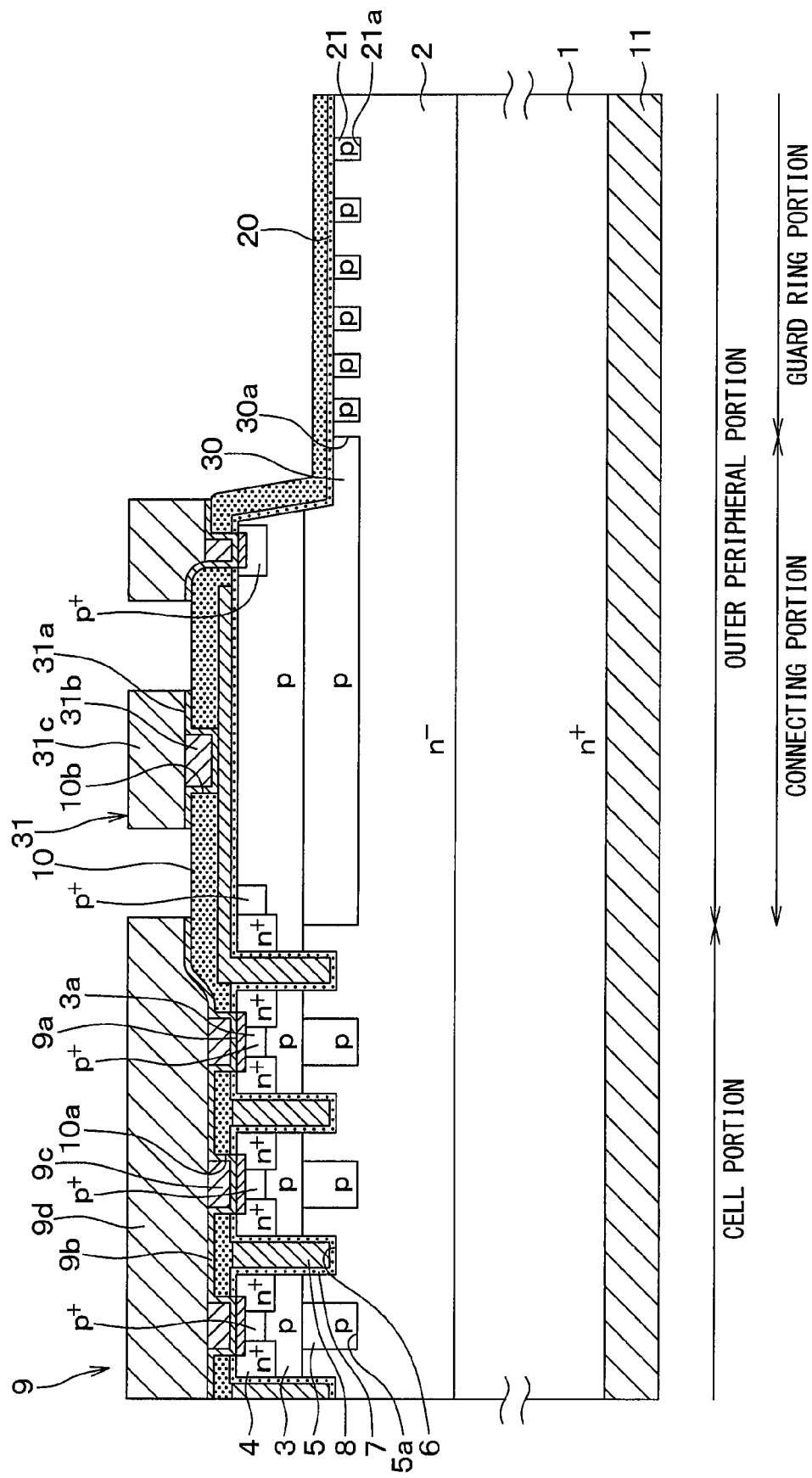
FIG. 3D is a cross-sectional view of the SiC semiconductor device in the manufacturing process subsequent to FIG. 3C.

FIG. 3D is a cross-sectional view when the process (4) is performed. First, since there is a possibility that a natural oxide film is formed on the bottom surfaces of the contact holes 10a and 10b during a period from the process (3) to the process (4), the natural oxide film is etched with the use of HF. Then, a Ti/TiN film is formed on the interlayer insulating film 10 including the inside of the contact holes 10a and 10b by sputtering or the like. As a result, a metal film for forming the barrier metals 9b and 31a is formed.

Next, after the W film has been formed by a CVD (chemical vapor deposition) method or the like, the W film is left only in the contact holes 10a and 10b by etching back, to thereby form the W plugs 9c and 31b. As a result, the surface of the Ti/TiN film formed on the interlayer insulating film 10 and the W plugs 9c and 31b become flat surfaces flush with each other. In other words, the base surfaces of the Al—Si layers 9d and 31c to be formed in a later step become flat surfaces.

Subsequently, the Al—Si film is formed by sputtering or the like. After a photoresist (not shown) has been formed on a surface of the Al—Si film, exposure and development are performed, and the photoresist is patterned by UV-irradiation. Further, the Al—Si film and the Ti/TiN film are etched with the use of masks made of photoresists, thereby patterning those films and performing sintering at a predetermined temperature. As a result, the Al—Si film and the Ti/TiN film are partitioned into portions close to the source electrode 9 and portions close to the gate pad 31 to form the Al—Si layers 9d and 31c and the barrier metals 9b and 31a.

Although not shown in the figure, a polyimide film or the like is formed and then patterned by etching using a mask such as a photoresist to form a protective film 40 whose portions corresponding to the source electrode 9 and the gate pad 31 are opened. Further, with application of Ni plating and Au plating, a Ni plating layer 9e and an Au layer 9f are formed on the surface of the Al—Si layer 9d exposed from the open portions of the protective film 40, and a Ni plating layer are an Au layer (not shown) is formed on the surface of the gate pad 31. Finally, the drain electrode 11 is formed on the rear surface of the $n^+$-type substrate 1.

The SiC semiconductor device according to the present embodiment is completed by the manufacturing method as described above. According to the manufacturing method described above, since the interlayer insulating film 10 is densified, the interlayer insulating film 10 is hardened as compared with the case where the densification is not performed. Thus, even if a heating process of high temperature is performed after the contact holes 10a and 10b have been formed in the interlayer insulating film 10, the corners of the side walls of the contact holes 10a and 10b are restricted from being rounded.

Thus, even if the amount of the Al—Si layers 9d and 31c serving as the metal electrodes entering into the contact holes 10a and 10b is large, the deformation of the interlayer insulating film 10 based on the stress is reduced, and the generation of cracks in the gate insulating film 7 due to the stress is reduced.

Further, according to the present embodiment, the W plugs 9c and 31b are buried in the contact holes 10a and 10b. Thus, when the W film configuring the W plugs 9c and 31b is formed, the W film can be completely buried in the contact holes 10a and 10b.

In other words, when the corners of the side walls of the contact holes 10a and 10b have rounded shapes, the entrance of the opening portions is wider than the bottom portion. Therefore, it difficult to completely bury the W films in the contact holes 10a and 10b when the W film configuring the W plugs 9c and 31b is formed. On the other hand, if the interlayer insulating film 10 can be made hard as in the present embodiment, the corner portions of the contact holes 10a and 10b are not rounded, and an angle formed by the bottom portion and the side wall is maintained at an angle close to a vertical angle of, for example, 85° or more. Thus, the entrances of the opening portions of the contact holes 10a and 10b are not shaped to be wider than the bottom portion, and the inside of the contact holes 10a and 10b can be completely filled with the W film. Therefore, the contact holes 10a and 10b are completely filled with the W plugs 9c and 31b, the surfaces of the Ti/TiN films formed on the interlayer insulating film 10 and the W plugs 9c and 31b are flush with each other, and the base surfaces of the Al—Si layers 9d and 31c can be flat surfaces.

As described above, since the Al—Si layers 9d and 31c can be formed on the base surfaces becoming the flat surface, the entrance of the Al—Si layers 9d and 31c into the contact holes 10a and 10b can be reduced. Therefore, when the Al—Si layers 9d and 31c are expanded and contracted, or when the Al—Si layers 9d and 31c are melted and then solidified by heat generation, the Al—Si layers 9d and 31c are only expanded and contracted or solidified on the flat surface, so that a stress applied to the interlayer insulating film 10 are reduced. In addition, since the melting point of W is higher than Al, even if the W plugs 9c and 31b are disposed in the contact holes 10a and 10b, the W plugs 9c and 31b are unlikely to be melted by heat generation. Accordingly, it possible to restrict the phenomenon that the W plugs 9c and 31b are melted and then solidified from occurring. Therefore, the stress applied to the interlayer insulating film 10 is further reduced.

Figure 4:
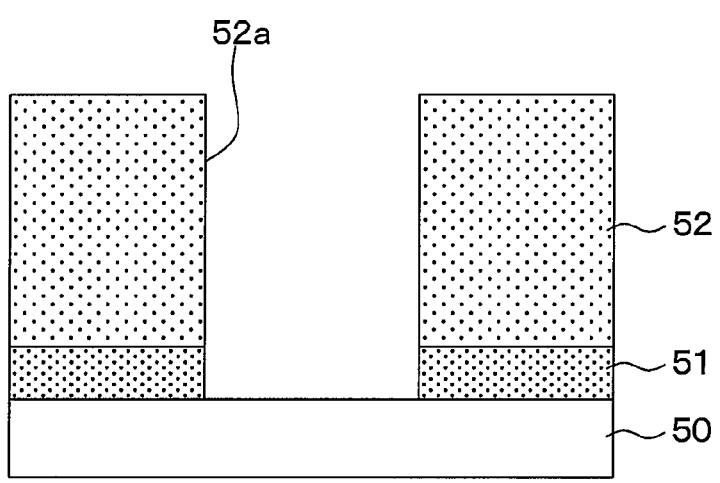
FIG. 4 is a cross-sectional view of a sample used in an experiment.

Next, the above effects will be described with reference to experimental results. In an experiment, as shown in FIG. 4, a Si substrate 50 is used instead of SiC, a tetraethoxysilane (TEOS) film 51 corresponding to the gate insulating film 7 is formed on the Si substrate 50, and a BPSG film 52 corresponding to the interlayer insulating film 10 is formed on the TEOS film 51. After the $H_2$ annealing has been performed, a contact hole 52a corresponding to the contact hole 10a is formed in the BPSG film 52. Multiple types of patterns of the contact holes 52a are prepared, shapes of the respective patterns when the BPSG film 52 are etched to form the contact holes 52a are examined, and variations in shape of the contact holes 52a are examined.

Figure 5A:
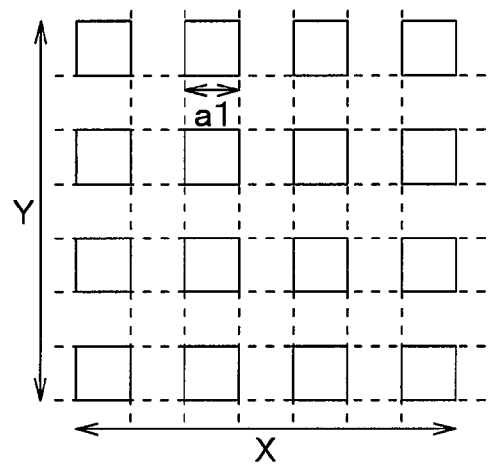
FIG. 5A is a top view layout diagram showing a shape of a contact hole of a pattern 1 in a sample used in the experiment.
Figure 5B:
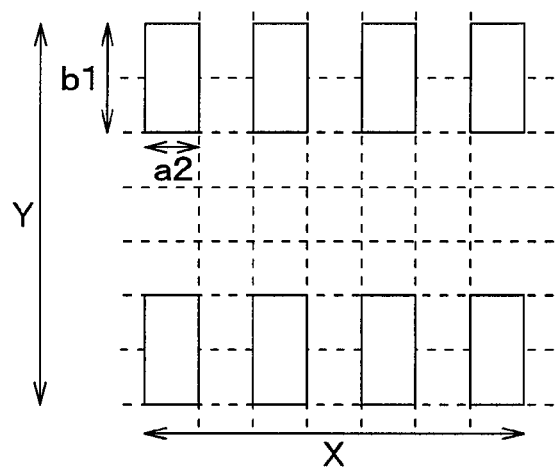
FIG. 5B is a top view layout diagram showing a shape of a contact hole of a pattern 2 in a sample used in the experiment.
Figure 5C:
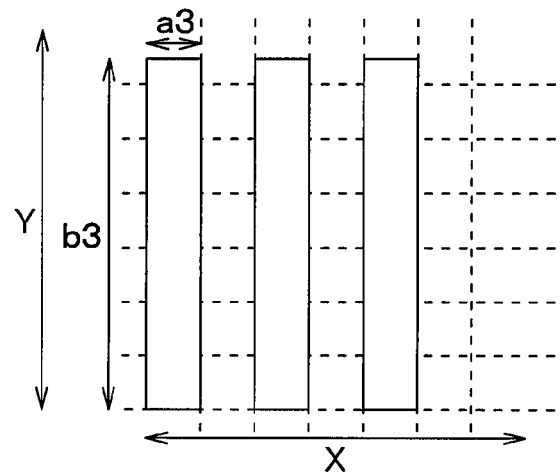
FIG. 5C is a top view layout diagram showing a shape of a contact hole of a pattern 3 in a sample used in the experiment.

Specifically, as shown in FIGS. 5A to 5C, the experiment is performed with the use of a pattern 1 in which multiple square shapes are arrayed in a dot shape, a pattern 2 in which a rectangular short line shapes are arrayed, and a pattern 3 in which line shapes are arrayed. The X-direction in FIGS. 5A to 5C corresponds to a left-to-right direction of FIG. 1, and in Patterns 1 and 2 shown in FIGS. 5A and 5B, the multiple contact holes 52a are arrayed in the cross section of FIG. 1. In the case of the SiC semiconductor device shown in FIG. 1, at least one of the contact holes 52a is provided so as to expose the $n^+$-type source regions 4 and the contact regions 3a. In this example, in the pattern 1, a length a1 of each side of the contact hole 52a is set to 0.45 µm. In the pattern 2, a short side a2 is set to 0.45 µm, and a long side b2 is set to 2.2 µm. In the pattern 3, a short side a3 is set to 0.45 µm, and a long side b3 is set to 2000 µm. The temperature of the $H_2$ annealing is changed to 800° C., 870° C., and 930° C., and an etching time is unified to 223 seconds to examine the variation in the shape of the side wall of the contact hole 52a, that is, an angle formed by the bottom surface of the interlayer insulating film 10 and the side surface of the contact hole 10a. Hereinafter, the angle defined by the bottom surface of the interlayer insulating film 10 and the side surface of the contact hole 10a is referred to as a side wall angle.

Figure 6A:
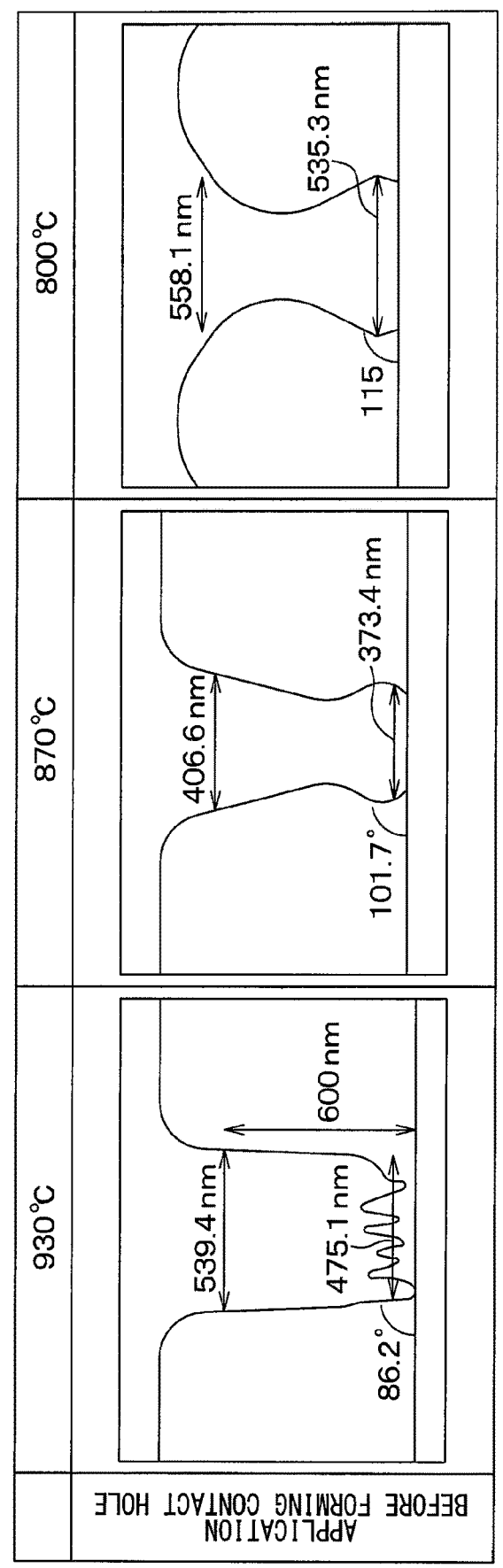
FIG. 6A is a cross-sectional view of a contact hole provided as the pattern 1.

First, as shown in FIG. 6A, in the case of the pattern 1, when the temperature of the $H_2$ annealing is set to 930° C., since the etching time is short, there is an etching residue at the bottom portion, but the side wall angle is 86.2°. In addition, the side wall is substantially straight and rises perpendicularly. On the other hand, when the temperature of the $H_2$ annealing is set to 800° C. or 870° C., the side wall angle of the contact hole 52a is 115° or 101.7°. More specifically, an opening cross-sectional area is gradually widened once from the bottom portion toward the entrance side in a forward tapered shape, and the opening cross-sectional area is gradually narrowed further toward the entrance side in a reverse tapered shape. Thus, the side wall angle exceeds 90°. Further toward the entrance side, the opening cross-sectional area is gradually widened in a forward tapered shape, but since there is a portion having a reverse tapered shape on the bottom side, a preferable trench shape is not obtained.

Figure 6B:
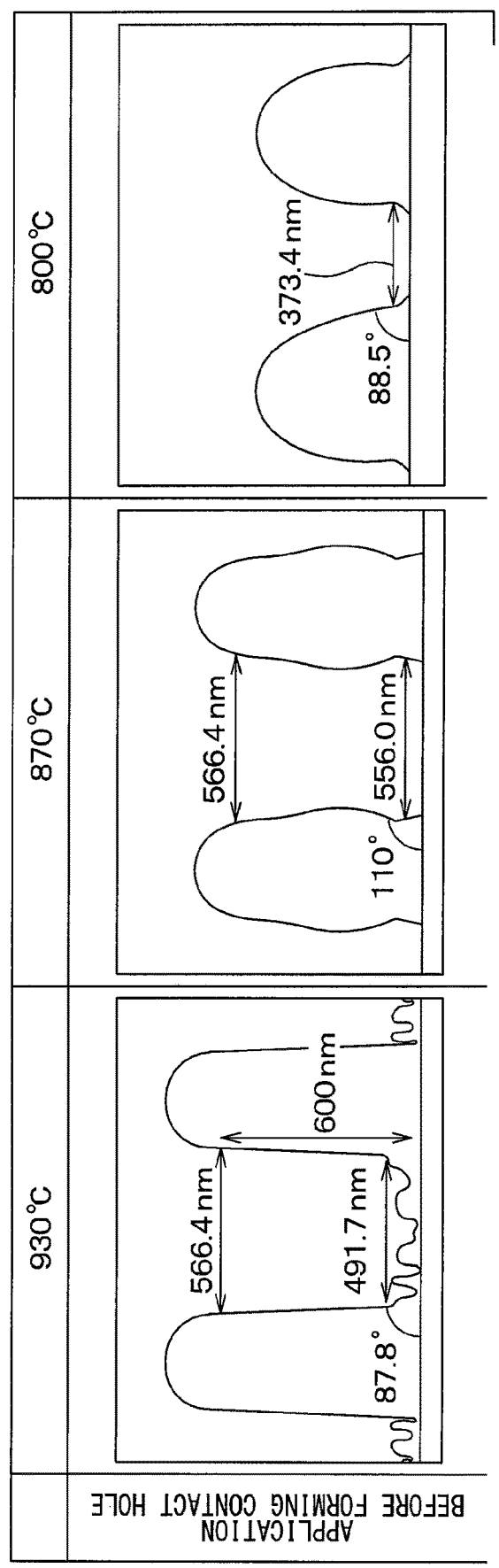
FIG. 6B is a cross-sectional view of a contact hole provided as the pattern 2.

As shown in FIG. 6B, in the case of the pattern 2, when the temperature of the $H_2$ annealing is set to 930° C. in the pattern 2, since the etching time is short, there is an etching residue at the bottom portion of the pattern 2, but the side wall angle of the pattern 2 is 87.8°. In addition, the side wall is substantially straight and rises perpendicularly. On the other hand, when the temperature of the $H_2$ annealing is set to 870° C., the side wall angle of the contact hole 52a is 110°. More specifically, an opening cross-sectional area is gradually widened from the bottom portion toward the entrance side in a forward tapered shape once, and the opening cross-sectional area is gradually narrowed further toward entrance side in a reverse tapered shape. Thus, the side wall angle exceeds 90°. Further toward the entrance side, the opening cross-sectional area is gradually widened in the forward tapered shape, but since there is a portion having a reverse tapered shape on the bottom side, a preferable trench shape is not obtained. When the temperature of the $H_2$ annealing is set to 800° C., the side wall angle of the contact hole 52a is 88.5°, but the opening cross-sectional area is wider on the entrance side than on the bottom side, and the side wall is rounded at the corner and does not rise perpendicularly.

Figure 6C:
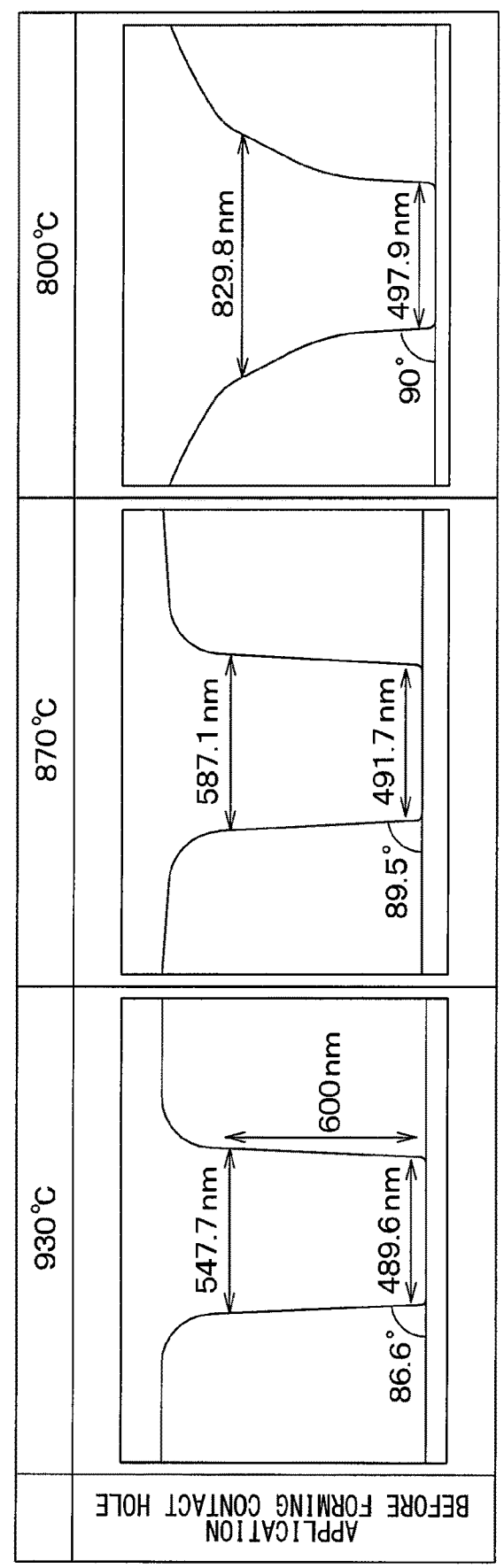
FIG. 6C is a cross-sectional view of a contact hole provided as the pattern 3.

Furthermore, as shown in FIG. 6C, in the case of the pattern 3, the side wall angle is 86.6° or 89.5° when the temperature of the $H_2$ annealing is set to 930° C. or 870° C. In addition, the side wall is substantially straight and rises perpendicularly. On the other hand, when the temperature of the $H_2$ annealing is set to 800° C., the side wall angle of the contact hole 52a is 90°, but the opening cross-sectional area is wider on the entrance side than on the bottom side, and the side wall is rounded at the corner and does not rise perpendicularly.

In this example, in order to reduce the influence of the stress by hardening the interlayer insulating film 10, it is preferable that the side wall angle is close to 90°, specifically 85° or more, and a condition that the side wall rises perpendicularly close to straightly is required.

When the shape variation of the side wall of the contact hole 52a at each temperature of the patterns 1 to 3 is confirmed from those points of view, it is found whether or not the patterns 1 to 3 have a resistance to the stress based on the shape variation of the side wall of the contact hole 52a. FIG. 7 is a table summarizing the above results. As shown in the graph, in the patterns 1 and 2, when the temperature of the $H_2$ annealing is set to 930° C., the temperature is OK with the resistance, and when the temperature is set to 870° C. or 800° C., the temperature is NG with an insufficient resistance. In the pattern 3, when the temperature of the $H_2$ annealing is set to 930° C. or 870° C., the temperature is OK with the resistance, and when the temperature is set to 800° C., the temperature is NG with the insufficient resistance.

As described above, according to the experiment in which the shape of the contact holes 10a is changed or the temperature of the $H_2$ annealing is changed, the following effects can be obtained. First, in the case of the pattern 1 in which the multiple square contact holes 10a are arrayed in the form of dots, the resistance to the stress can be obtained when the temperature of the $H_2$ annealing is set to 930° C. or higher. Also in the case of the pattern 2 in which the contact holes 10a are arrayed in a rectangular short line shape, the resistance to the stress can be obtained when the temperature of the $H_2$ annealing is set to 930° C. or higher. Further, in the case of the pattern 3 in which the line shaped contact holes 10a are arrayed, the resistance to the stress can be obtained when the temperature of the $H_2$ annealing is set to 870° C. or higher.

In this example, in the patterns 1 to 3, the experimental results are shown by taking an example of the length of each side, but the same results are obtained even if a length other than the above-described length is employed. From the experimental results, for example, when the length a1 of each side of the pattern 1 and the lengths a2 and a3 of the short sides of the patterns 2 and 3 fall within a range of 0.3 μm to 0.6 μm, the same results as described above are obtained.

In addition, as in the present embodiment, the hydrogen concentration or the impurity concentration of each portion when the interlayer insulating film 10 is densified by performing the $H_2$ annealing after the interlayer insulating film 10 is allowed to flow by performing reflow by the $N_2$ annealing is confirmed. A relationship between the densification of the interlayer insulating film 10 and the hydrogen concentration or the impurity concentration of each portion will be described with reference to FIGS. 8, 9, and 10.

Figure 8:
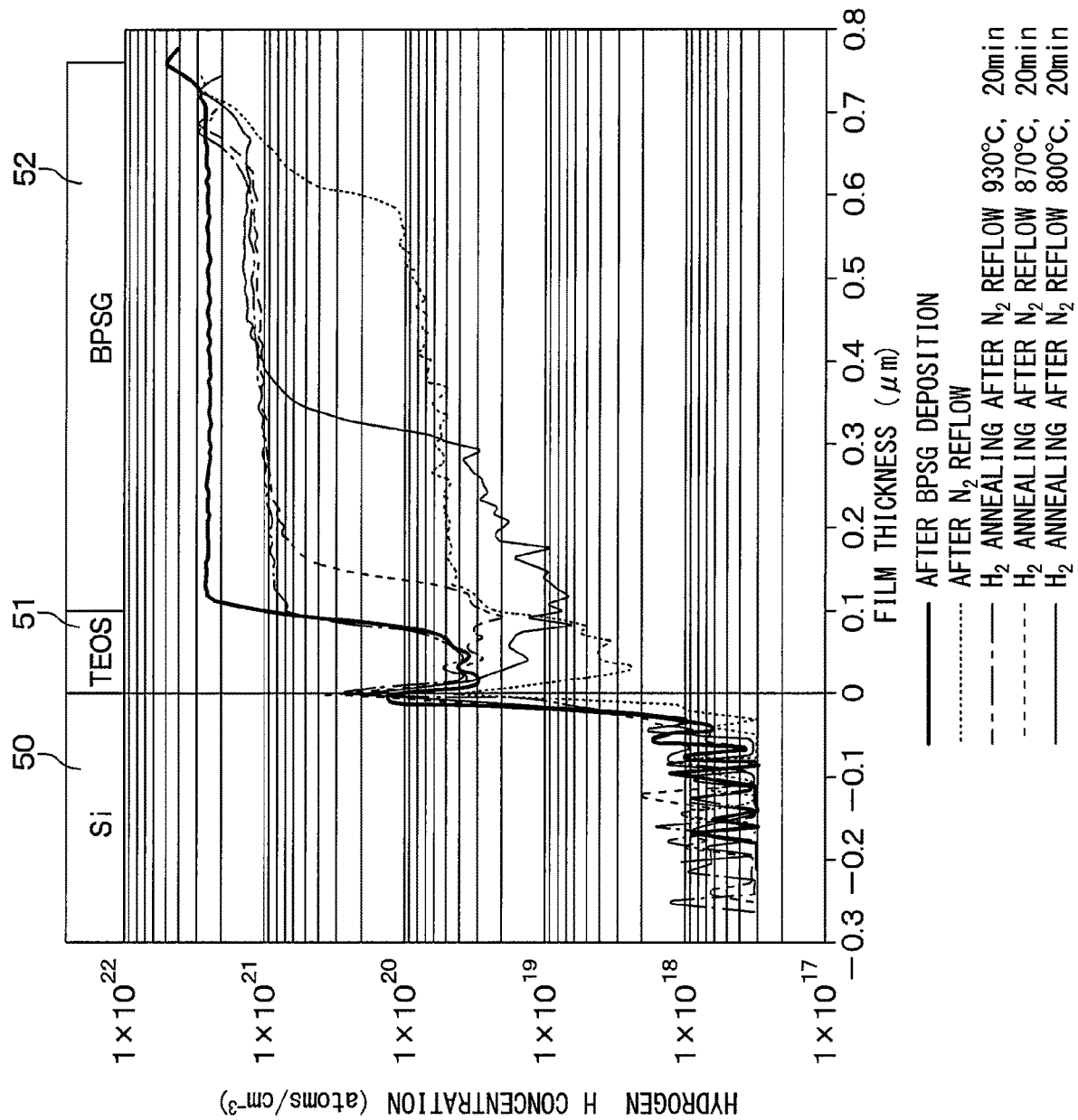
FIG. 8 is a diagram showing measurement results of a hydrogen concentration distribution.
Figure 9:
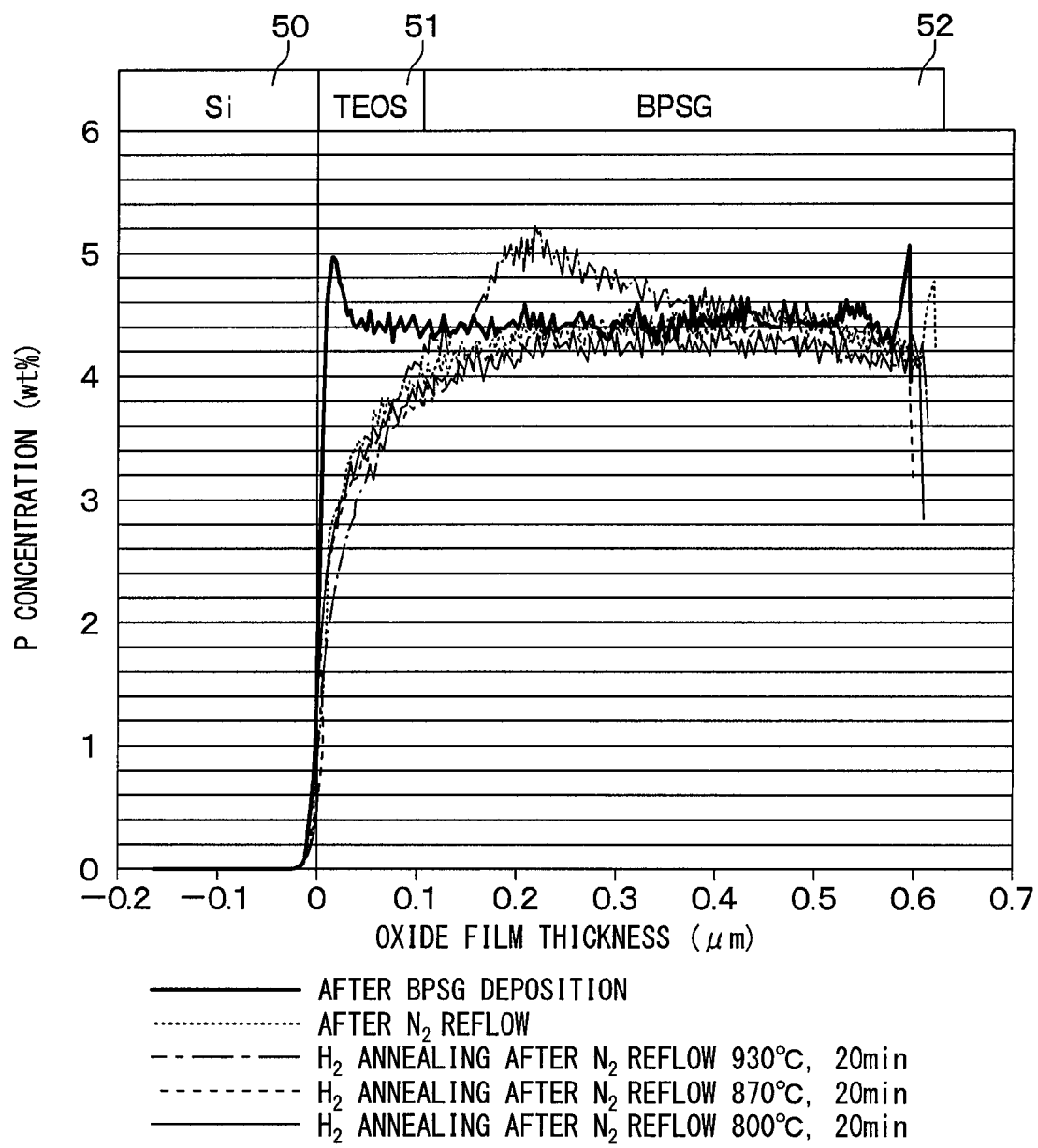
FIG. 9 is a graph showing measurement results of a phosphorus concentration distribution.
Figure 10:
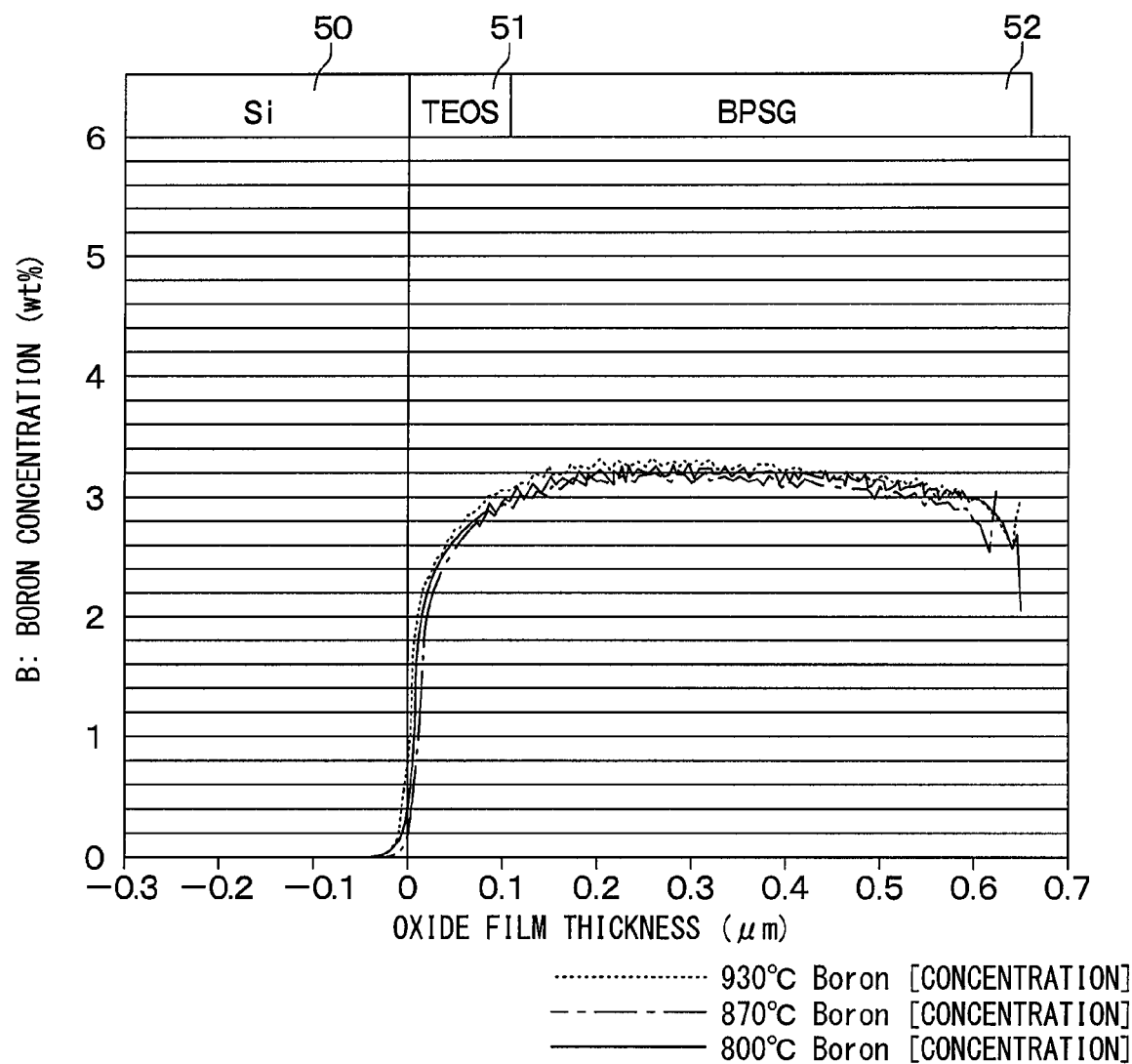
FIG. 10 is a graph showing measurement results of a boron concentration distribution.

Similarly, as an experimental sample, the TEOS film 51 is formed on the sample of FIG. 4, that is, the Si substrate 50 and the BPSG film 52 is formed on the TEOS film 51 to perform reflow by $N_2$ annealing or $H_2$ annealing. Then, in each of a case in which only the BPSG film is formed as the interlayer insulating film 10, a case in which only reflow by $N_2$ annealing is performed, and a case in which $H_2$ annealing is performed by changing the temperature after reflow, the hydrogen concentration distribution and the impurity concentration distribution is examined. Reflow by $N_2$ annealing is performed at 950° C. for 20 minutes. FIG. 8 shows the measurement results of the hydrogen concentration distribution of the above distributions. FIGS. 9 and 10 show the measurement results of the phosphorus concentration distribution and the boron concentration distribution, respectively.

As can be seen from FIG. 8, the hydrogen concentration in the BPSG film 52 becomes high because hydrogen escape due to reflow has not yet occurred in a pre-reflow state. On the other hand, after the reflow is performed, the hydrogen concentration is greatly reduced to $1 \times 10^{20}$ cm$^{-3}$ or less by the hydrogen removal. In this state, the BPSG film 52 is not dense, that is, is in a soft state, and the influence of the stress cannot be reduced. However, if the $H_2$ annealing is performed thereafter, the hydrogen concentration increases and reaches $1 \times 10^{20}$ cm$^{-3}$ or more. In particular, when the temperature is 870° C. or higher, in this example, 870° C. and 930° C., the hydrogen concentration is $1 \times 10^{20}$ cm$^{-3}$ or higher in almost the entire thickness direction of the BPSG film 52.

In this manner, when the hydrogen concentration is $1 \times 10^{20}$ cm$^{-3}$ or more, the BPSG film 52 can be made dense by a bonding force between hydrogen and Si or Si—O which has not become the $SiO_2$ in the BPSG film 52, and the influence of the stress can be reduced.

Referring to FIG. 9, in the state before reflow, the phosphorus concentration is kept constant. This state can be regarded as a state in which phosphorus is combined with Si or Si—O which has not become the $SiO_2$, and a bonding strength of the BPSG film 52 can be enhanced. On the other hand, in the case where only reflow is performed or in the case where $H_2$ annealing is performed after reflow, although the phosphorus concentration is lowered at a boundary position with the TEOS film 51, the phosphorus concentration is set to 2 wt % or more in the entire region. Further, when the $H_2$ annealing is performed at 930° C., the phosphorus concentration is increased so as to have a maximum value in the vicinity of the TEOS film 51 of the BPSG film 52.

As described above, since the phosphorus concentration can be set to 2 wt % or more even after the $H_2$ annealing has been performed, Si or Si—O which has not been completely formed in the $SiO_2$ is combined with phosphorus, and the bonding strength of the BPSG film 52 can be enhanced. In particular, when the $H_2$ annealing is performed at 930° C., the phosphorus concentration is 5 wt % at the maximum value, and in particular, the BPSG film 52 can be densified. Therefore, with the execution of the $H_2$ annealing, in particular, at 930° C. or higher, the BPSG film 52 can be densified, and the influence of the stress can be further reduced.

Referring to FIG. 10, in the state before reflow, the boron concentration is kept constant. This state can be regarded as a state in which boron is also combined with Si or Si—O which has not become the $SiO_2$, and the bonding strength of the BPSG film 52 can be enhanced. On the other hand, when only reflow is performed or when $H_2$ annealing is performed after reflow, although the boron concentration is lowered at the boundary position with the TEOS film 51, the boron concentration is 2 wt % or more in the entire region.

As described above, since the boron concentration can be set to 2 wt % or more even after the $H_2$ annealing has been performed, Si or Si—O which has not been completely formed in the $SiO_2$ is combined with boron, and the bonding strength of the BPSG film 52 can be enhanced. Therefore, the boron concentration can be maintained even if the $H_2$ annealing is performed, and the BPSG film 52 can be densified, so that the effect of the stress can be further reduced.

Further, according to the present embodiment, since the gate insulating film 7 remains as the base insulating film of the interlayer insulating film 10, the TEOS film 51 of the sample used in the experiment described above has the same structure as that of the remaining base insulating film of the BPSG film 52.

Looking at the TEOS film 51, as shown in FIG. 8, the hydrogen concentration is lower than the hydrogen concentration in the BPSG film 52, and is less than $1 \times 10^{20}$ cm$^{-3}$, in this example, $1 \times 10^{19}$ cm$^{-3}$ or less. The maximum value of the hydrogen concentration in a film including both the TEOS film 51 and the BPSG film 52 is present at an interface between the TEOS film 51 and the BPSG film 52. This indicates that the TEOS film 51 serves as a stopper to reduce the diffusion of hydrogen from the BPSG film 52. In this manner, the TEOS film 51, in other words, the gate insulating film 7 in the SiC semiconductor device functions as a stopper for stopping the diffusion of hydrogen, so that the interlayer insulating film 10 can be reliably filled with hydrogen.

In addition, many unbonded bonds exist at the interface between the films, and hydrogen is likely to be bonded to the unbonded bonds. Thus, when the hydrogen concentration is set to have the maximum value at the interface between the TEOS film 51 and the BPSG film 52, the unbonded bonds existing at the interface can be bonded to hydrogen. Thus, the TEOS film serving as the base of the BPSG film 52, in other words, the gate insulating film 7 serving as the base of the interlayer insulating film 10 can be made firm, and the generation of cracks due to the influence of the stress can be further reduced.

Second Embodiment

A second embodiment will be described. In the present embodiment, a process order of the $H_2$ annealing is changed from the first embodiment, and the other processes are the same as those in the first embodiment. Therefore, only portions different from those in the first embodiment will be described.

In the first embodiment, as the process (1), the $H_2$ annealing is performed as the densification process of the interlayer insulating film 10 after the interlayer insulating film 10 has been formed and before the contact holes 10a are provided. On the other hand, according to the present embodiment, after the formation of the contact holes 10a in the process (1) and prior to the formation of the metal silicide 9a in the process (2), the $H_2$ annealing is performed as the densification process of the interlayer insulating film 10.

As described above, the corners of the side walls of the contact holes 10a provided in the interlayer insulating film 10 are rounded because a high temperature treatment is performed. Thus, if the $H_2$ annealing is performed as the densification process of the interlayer insulating film 10 prior to the process of performing the high temperature treatment, the corners of the side walls of the contact holes 10a can be restricted from being rounded. Therefore, even if the $H_2$ annealing is performed as the densification process of the interlayer insulating film 10 after the formation of the contact hole 10a and before the formation of the metallic silicide 9a, the same effects as those of the first embodiment can be obtained.

Specifically, the fact that the same effects as those of the first embodiment can be obtained even when the manufacturing order as in the present embodiment is applied will be described with reference to experimental results. In the experimental method, the same method as in the first embodiment is employed, and a sample in which a TEOS film 51 and a BPSG film 52 are formed on a silicon substrate 50 as shown in FIG. 4 is used. Then, contact holes 52a having shapes of patterns 1 to 3 shown in FIGS. 5A to 5C are formed in the BPSG film 52, and a shape variation of the contact holes 52a is examined.

Figure 11A:
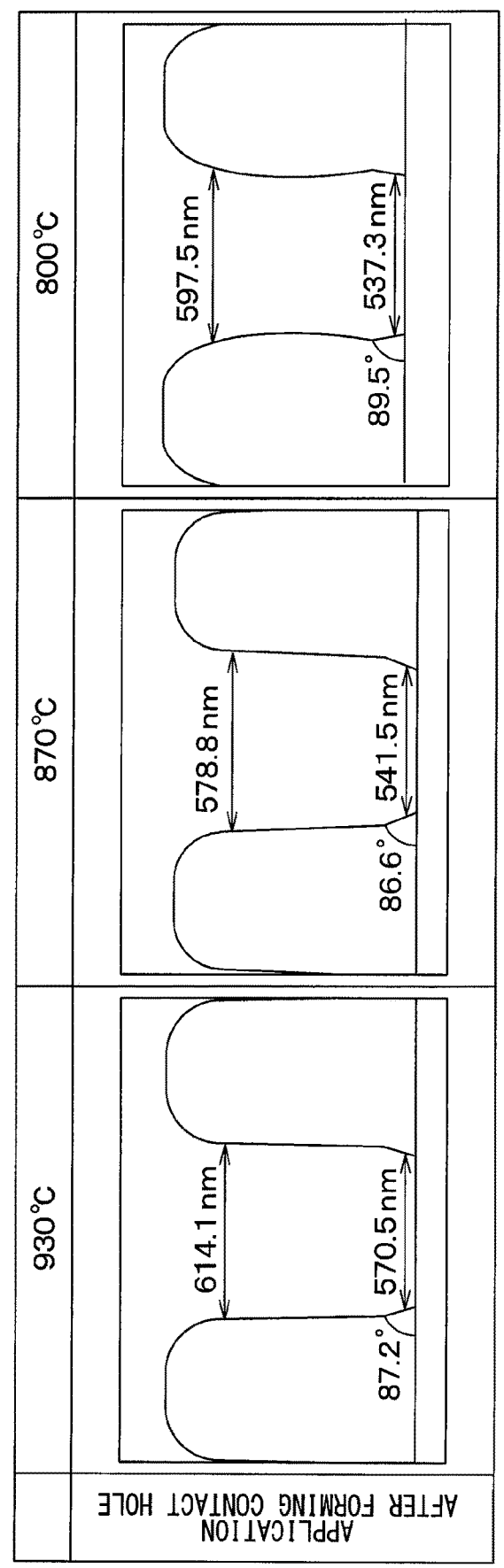
FIG. 11A is a cross-sectional view of the contact hole provided as the pattern 1.

First, as shown in FIG. 11A, in the pattern 1, when the temperature of the $H_2$ annealing is set to 930° C. or 870° C., a side wall angle is 87.2° or 86.6°. In addition, the side wall is substantially straight and rises perpendicularly. On the other hand, when the temperature of the $H_2$ annealing is set to 800° C., the side wall angle of the contact holes 52a is 89.5°, but an opening cross-sectional area is gradually widened from a bottom portion toward an entrance side and then becomes a reverse tapered shape that is once narrowed. In other words, the side wall is not in a forward tapered state in the entire region, and is not in a perpendicularly rising state.

Figure 11B:
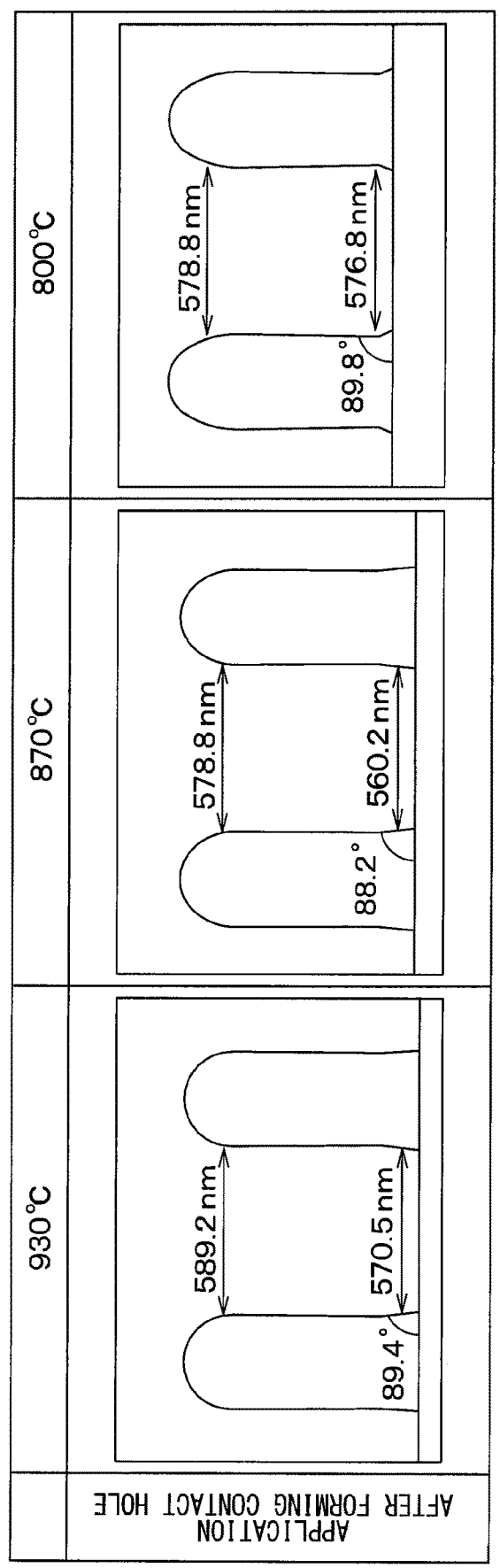
FIG. 11B is a cross-sectional view of the contact hole provided as the pattern 2.

As shown in FIG. 11B, in the pattern 2, when the temperature of the $H_2$ annealing is set to 930° C. or 870° C., the side wall angle is 89.4° or 88.2°. In addition, the side wall is substantially straight and rises perpendicularly. On the other hand, when the temperature of the $H_2$ annealing is set to 800° C., the side wall angle of the contact holes 52a is 89.8°, but an opening cross-sectional area is gradually widened from a bottom portion toward an entrance side and then becomes a reverse tapered shape that is once narrowed. In other words, the side wall is not in a forward tapered state in the entire region, and is not in a perpendicularly rising state.

Figure 11C:
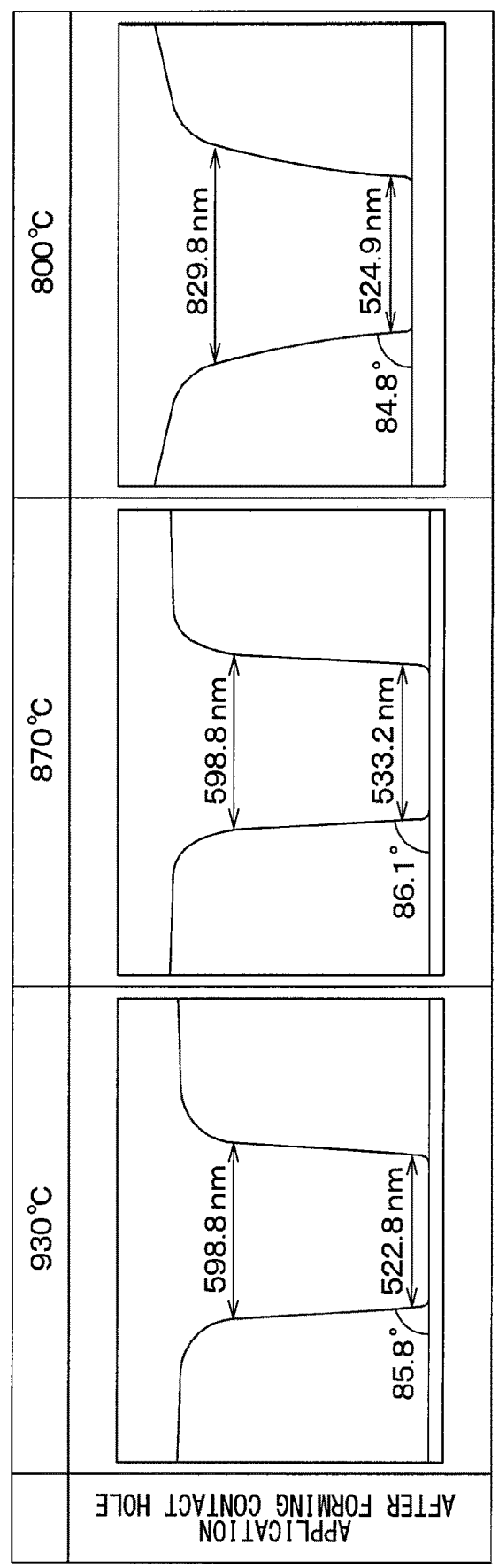
FIG. 11C is a cross-sectional view of the contact hole provided as the pattern 3.

Furthermore, as shown in FIG. 11C, in the pattern 3, the side wall angle is 85.8° or 86.1° when the temperature of the $H_2$ annealing is set to 930° C. or 870° C. In addition, the side wall is substantially straight and rises perpendicularly. On the other hand, when the temperature of the $H_2$ annealing is set to 800° C., the side wall angle of the contact hole 52a is 84.8°, but the opening cross-sectional area is wider on the entrance side than on the bottom side, and the side wall is rounded at the corner and does not rise perpendicularly.

As described above, in order to reduce the influence of the stress by hardening the interlayer insulating film 10, it is preferable that the side wall angle is close to 90°, specifically 85° or more, and a condition that the side wall rises perpendicularly close to straightly is required.

From those points of view, when the shape variation of the side wall of the contact hole 52a at each temperature of the patterns 1 to 3 is confirmed, it is found whether or not the patterns 1 to 3 have a resistance to the stress based on the shape variation of the side wall of the contact hole 52a. FIG. 12 is a table summarizing the results. As shown in this table, in any of the patterns 1 to 3, when the temperature of the $H_2$ annealing is set to 930° C. and 870° C., the temperature is OK with a resistance, and when the temperature is set to 800° C., the temperature is NG with an insufficient resistance.

As described above, even if the $H_2$ annealing is performed as the densification process of the interlayer insulating film 10 after the formation of the contact hole 10a and before the formation of the metallic silicide 9a, the same effects as those of the first embodiment can be obtained. In particular, in the patterns 1 and 2, the same effects as those of the first embodiment can be achieved by setting the temperature to 870° C. or more without setting the temperature to 930° C. or more.

Similarly, in this example, in the patterns 1 to 3, the experimental results are shown by taking an example of the length of each side, but the same results are obtained even if a length other than the above-described length is employed. From the experimental results, for example, when the length a1 of each side of the pattern 1 and the lengths a2 and a3 of the short sides of the patterns 2 and 3 fall within a range of 0.3 to 0.6 μm, the same results as described above have been obtained.

OTHER EMBODIMENTS

Although the present disclosure has been described in accordance with the embodiments described above, the present disclosure is not limited to the embodiments described above, and encompasses various modifications and variations within the scope of equivalents. In addition, various combinations and configurations, as well as other combinations and configurations that include only one element, more, or less, are within the scope and spirit of the present disclosure.

For example, although the SiC semiconductor device has been described as an example in the embodiments described above, the present disclosure can be applied to other semiconductor materials, that is, a semiconductor device using Si or a compound semiconductor.

The influence of the stress is particularly conspicuous in the semiconductor device having the semiconductor element having the MOS structure including the gate insulating film 7 as described in the first and second embodiments, but the influence of the stress is not limited to the semiconductor element having the MOS structure. Thus, in addition to the MOSFET described in the first and second embodiments, the present disclosure can be applied to a semiconductor device having a semiconductor element with another MOS structure or having a semiconductor element other than the MOS structure.

For example, in the first and second embodiments, the n-channel type MOSFET in which the first conductivity type is an n-type and the second conductivity type is a p-type has been described as an example, but a p-channel type MOSFET in which the conductivity types of the respective components are inverted may be used. In addition to the MOSFET as the semiconductor device, the present disclosure can be applied to an IGBT having a similar structure. The IGBT only changes the conductivity type of the $n^+$-type substrate 1 from the n-type to the p-type for each of the above-described embodiments, and the other structures and manufacturing methods are similar to those of each of the above-described embodiments. Further, although the trench gate structure is exemplified as the vertical MOSFET, the vertical MOSFET is not limited to the trench gate structure, and may be a planar type. The present disclosure can also be applied to a semiconductor device having a Schottky barrier diode or the like as a semiconductor element other than the semiconductor element having the MOS structure, for example.

Further, the manufacturing methods of the SiC semiconductor device described in the first and second embodiments are merely examples, and steps may be added, deleted, or changed to other steps as necessary. For example, although it is preferable to perform the process of forming the metal silicide 9a in order to reduce a contact resistance, this process may be reduced. In addition, the process of forming the metal silicide 9a is exemplified as a process of performing the high temperature treatment. However, since the other high temperature treatment may cause a stress generating factor, the densification process of the interlayer insulating film 10 is effectively performed even if the process of forming the metal silicide 9a is not performed.

In the embodiment shown in FIG. 1, it is assumed that the $n^+$-type source region 4 is formed by ion implantation, but the $n^+$-type source region 4 can also be formed by epitaxial growth.

What is claimed is:

1. A semiconductor device comprising:
   a semiconductor in which a semiconductor element is formed;
   an interlayer insulating film disposed above the semiconductor, having a contact hole connected to the semiconductor element, and containing phosphorus; and
   a metal electrode disposed above the interlayer insulating film and connected to the semiconductor element through the contact hole, wherein
   the interlayer insulating film is filled with hydrogen, and
   a phosphorus concentration distribution in the interlayer insulating film is non-uniform and a maximum value of the phosphorus concentration distribution is skewed toward the semiconductor.

2. The semiconductor device according to claim 1, wherein
   a phosphorus concentration is 2 wt % or more in an entire region of the interlayer insulating film.

3. The semiconductor device according to claim 1, wherein
   the interlayer insulating film further contains boron, and
   a boron concentration is 2 wt % in an entire region of the interlayer insulating film.

4. The semiconductor device according to claim 1, wherein
   the contact hole is buried with a tungsten plug, and
   a base surface of the metal electrode is flat.

5. The semiconductor device according to claim 1, wherein
   the semiconductor includes a cell portion in which the semiconductor element is formed and an outer peripheral portion that includes a guard ring portion surrounding the cell portion,
   the semiconductor has a recess portion in the guard ring portion so as to provide a step between the cell portion and the guard ring portion, and
   the interlayer insulating film covers the step.

6. The semiconductor device according to claim 1, wherein
   a hydrogen concentration in the interlayer insulating film is $1 \times 10^{20}$ cm$^{-3}$ or more.

7. A semiconductor device comprising:
   a semiconductor in which a semiconductor element is formed;
   an interlayer insulating film disposed above the semiconductor, having a contact hole connected to the semiconductor element, and containing at least one of phosphorus and boron; and a metal electrode disposed above the interlayer insulating film and connected to the semiconductor element through the contact hole, wherein the interlayer insulating film is filled with hydrogen, and a top surface shape of the contact hole is a square, a length of one side of the square is set to 0.3 µm to 0.6 µm, and a side wall angle defined by a bottom surface of the interlayer insulating film and a side surface of the contact hole is 85° or more.

8. A semiconductor device comprising:

a semiconductor in which a semiconductor element is formed;

an interlayer insulating film disposed above the semiconductor, having a contact hole connected to the semiconductor element, and containing at least one of phosphorus and boron; and a metal electrode disposed above the interlayer insulating film and connected to the semiconductor element through the contact hole, wherein the interlayer insulating film is filled with hydrogen, and the contact hole has a linear shape with a rectangular top shape, a length of a short side of the rectangular shape is set to 0.3 µm to 0.6 µm, and a side wall angle defined by the bottom surface of the interlayer insulating film and the side surface of the contact hole is 85° or more.

9. A semiconductor device comprising:

a semiconductor in which a semiconductor element is formed;

an interlayer insulating film disposed above the semiconductor, having a contact hole connected to the semiconductor element, containing at least one of phosphorus and boron, and filled with hydrogen;

a metal electrode disposed above the interlayer insulating film and connected to the semiconductor element through the contact hole; and a base insulating film having a hydrogen concentration lower than a hydrogen concentration of the interlayer insulating film, and disposed between the semiconductor and the interlayer insulating film, wherein a maximum value of the hydrogen concentration in a film including both the interlayer insulating film and the base insulating film is present at an interface between the interlayer insulating film and the base insulating film.

10. The semiconductor device according to claim 9, wherein the hydrogen concentration of the base insulating film is less than $1 \times 10^{20}$ cm$^{-3}$.

11. The semiconductor device according to claim 9, wherein the semiconductor element in the semiconductor includes:

a semiconductor substrate made of silicon carbide, having a high-concentration impurity layer of a first conductivity type or a second conductivity type on a rear surface side, and having a drift layer of the first conductivity type on a front surface side, the drift layer having an impurity concentration lower than an impurity concentration of the high-concentration impurity layer;

a base region disposed above the drift layer and made of silicon carbide of the second conductivity type, and a source region disposed above the base region and made of silicon carbide of the first conductivity type having an impurity concentration higher than the impurity concentration of the drift layer, the semiconductor device further comprising:

a trench gate structure including a gate insulating film disposed in a gate trench provided from a front surface of the source region to a depth deeper than a depth of the base region and disposed on an inner wall surface of the gate trench, and an gate electrode disposed on the gate insulating film;

a first electrode connected to the source region and the base region; and a second electrode connected to the high-concentration impurity layer, wherein the gate insulating film configures the base insulating film, and the metal electrode is included in the first electrode.

12. A manufacturing method of a semiconductor device that includes:

a semiconductor in which a semiconductor element is formed;

an interlayer insulating film disposed above the semiconductor, having a contact hole connected to the semiconductor element, and containing at least one of phosphorus and boron; and a metal electrode disposed above the interlayer insulating film and connected to the semiconductor element through the contact hole, wherein the semiconductor has a cell portion in which the semiconductor element is formed and an outer peripheral portion that includes a guard ring portion surrounding the cell portion, the semiconductor has a recess portion in the guard ring portion so as to provide a step between the cell portion and the guard ring portion, and the interlayer insulating film covers the step, the manufacturing method comprising:

forming the interlayer insulating film above the semiconductor in which the step is defined by providing the recess portion;

performing reflow to cause the interlayer insulating film to flow and to cover the step with the interlayer insulating film having a predetermined film thickness;

providing the contact hole after covering the step with the interlayer insulating film having the predetermined film thickness; and performing hydrogen annealing at 870° C. or more to fill the interlayer insulating film with hydrogen and to densify the interlayer insulating film after providing the contact hole.

* * * * *